United States Patent
Han et al.

(10) Patent No.: US 11,362,107 B2
(45) Date of Patent: Jun. 14, 2022

(54) NONVOLATILE MEMORY DEVICE HAVING A FERROELECTRIC LAYER

(71) Applicant: SK hynix Inc., Icheon-si (KR)

(72) Inventors: Jae Hyun Han, Icheon-si (KR); Se Ho Lee, Yongin-si (KR); Hyangkeun Yoo, Seongnam-si (KR); Jae Gil Lee, Seoul (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/891,469

(22) Filed: Jun. 3, 2020

(65) Prior Publication Data

US 2021/0175252 A1    Jun. 10, 2021

(30) Foreign Application Priority Data

Dec. 9, 2019    (KR) .................. 10-2019-0163140

(51) Int. Cl.
| | |
|---|---|
| H01L 27/11597 | (2017.01) |
| H01L 29/788 | (2006.01) |
| H01L 29/78 | (2006.01) |
| H01L 29/786 | (2006.01) |
| H01L 27/11587 | (2017.01) |

(52) U.S. Cl.
CPC .. H01L 27/11597 (2013.01); H01L 27/11587 (2013.01); H01L 29/7827 (2013.01); H01L 29/7889 (2013.01); H01L 29/78391 (2014.09); H01L 29/78642 (2013.01); H01L 29/78696 (2013.01)

(58) Field of Classification Search
CPC ........... H01L 27/1159; H01L 27/11587; H01L 27/11597; H01L 29/7827; H01L 29/78391; H01L 29/78642; H01L 29/78696; H01L 29/7889
See application file for complete search history.

(56) References Cited

U.S. PATENT DOCUMENTS

| | | | |
|---|---|---|---|
| 9,818,848 B2 | 11/2017 | Sun et al. | |
| 10,211,223 B2* | 2/2019 | Van Houdt | ....... H01L 29/40111 |
| 2013/0043455 A1* | 2/2013 | Bateman | ............... H01L 27/249 257/5 |
| 2016/0322368 A1* | 11/2016 | Sun | ...................... H01L 27/1159 |
| 2017/0358599 A1* | 12/2017 | Ramaswamy | ........ G11C 11/223 |
| 2019/0123061 A1* | 4/2019 | Liu | ..................... G11C 11/2273 |
| 2020/0357821 A1* | 11/2020 | Chen | .................. H01L 27/1159 |

FOREIGN PATENT DOCUMENTS

KR    101649091 B1    8/2016

\* cited by examiner

*Primary Examiner* — Matthew E Warren

(57) ABSTRACT

A nonvolatile memory device according to an embodiment includes a substrate having an upper surface, a source electrode structure disposed on the substrate, and a channel structure disposed over the substrate and disposed to contact one sidewall surface of the source electrode structure. In addition, the nonvolatile memory device includes a drain electrode structure disposed to contact one sidewall surface of the channel structure over the substrate. In addition, the nonvolatile memory device includes a plurality of ferroelectric structures extending in a first direction perpendicular to the substrate in the channel structure and disposed to be spaced apart from each other along the second direction perpendicular to the first direction. In addition, the nonvolatile memory device includes a gate electrode structure disposed in each of the plurality of ferroelectric structure to extend along the first direction.

5 Claims, 21 Drawing Sheets

NONVOLATILE MEMORY DEVICE HAVING A FERROELECTRIC LAYER

CROSS-REFERENCE TO RELATED APPLICATION

The present application claims priority under 35 U.S.C. § 119(a) to Korean Patent Application No. 10-2019-0163140, filed on Dec. 9, 2019, which is herein incorporated by reference in its entirety.

BACKGROUND

1. Technical Field

The present disclosure relates generally to a nonvolatile memory device and, more particularly, to a nonvolatile memory device having a ferroelectric layer.

2. Related Art

As the design rule decreases and the degree of integration increases, research has continued on the structures of semiconductor devices that can guarantee both structural stability and reliability of signal storage operations. Currently, a flash memory device of a charge storage method using a three-layer stacked structure of a charge tunneling layer, a charge trap layer, and a charge barrier layer has been widely utilized.

Recently, various nonvolatile memory devices having different structures from existing flash memory devices have been proposed. An example of nonvolatile memory devices is a ferroelectric memory device of a transistor structure. The ferroelectric memory device can store any one of remanent polarization having different sizes and orientations as signal information in a gate ferroelectric layer in a nonvolatile manner. In addition, the signal information can be read out by using a feature in which the magnitude of the operation current flowing through a channel layer between source and drain electrodes changes according to the stored remanent polarization.

SUMMARY

A nonvolatile memory device according to an aspect of the present disclosure includes a substrate having an upper surface and a source electrode structure disposed on the substrate. The source electrode structure includes a plurality of source electrode layer patterns and a plurality of source insulation layer patterns which are sequentially stacked in a first direction perpendicular to the upper surface, and the source electrode structure extends in a second direction perpendicular to the first direction. In addition, the nonvolatile memory device includes a channel structure disposed over the substrate and disposed to contact one sidewall surface of the source electrode structure. The one sidewall surface of the source electrode structure forms a plane substantially parallel to the first and second directions. In addition, the nonvolatile memory device includes a drain electrode structure disposed to contact one sidewall surface of the channel structure over the substrate. The drain electrode structure includes a plurality of drain electrode layer patterns and a plurality of drain insulation layer patterns which are sequentially stacked in the first direction, and the drain electrode structure extends in the second direction. In addition, the nonvolatile memory device includes a plurality of ferroelectric structures extending in the first direction in the channel structure and disposed to be spaced apart from each other along the second direction and gate electrode structures disposed in each of the plurality of ferroelectric structures to extend along the first direction.

A nonvolatile memory device according to another aspect of the present disclosure includes a substrate having an upper surface, and a plurality of global source lines disposed over the substrate. The plurality of global source lines are disposed to be spaced apart from each other along a first direction perpendicular to the substrate, and each of the plurality of global source lines includes a source electrode layer pattern extending along a second direction perpendicular to the first direction. In addition, the nonvolatile memory device includes a channel structure disposed to contact the plurality of global source lines in a third direction perpendicular to the first and second directions, over the substrate. In addition, the nonvolatile memory device includes a plurality of global drain lines disposed to contact one sidewall of the channel structure in the third direction over the substrate. The plurality of global drain lines are disposed to be spaced apart from each other along the first direction, and each of the plurality of global drain lines includes a drain electrode layer pattern extending along the second direction. In addition, the nonvolatile memory device includes a plurality of gate electrode structures extending in the first direction in the channel structure and disposed to be spaced apart from each other along the second direction, a plurality of ferroelectric structures extending in the first direction in the channel structure and each of the ferroelectric structures are disposed to surround the gate electrode structure, and a plurality of interfacial insulation structures extending in the first direction in the channel structure and each of the plurality of interfacial insulation structures are disposed to surround the ferroelectric structure.

DETAILED DESCRIPTION

Figure 1:
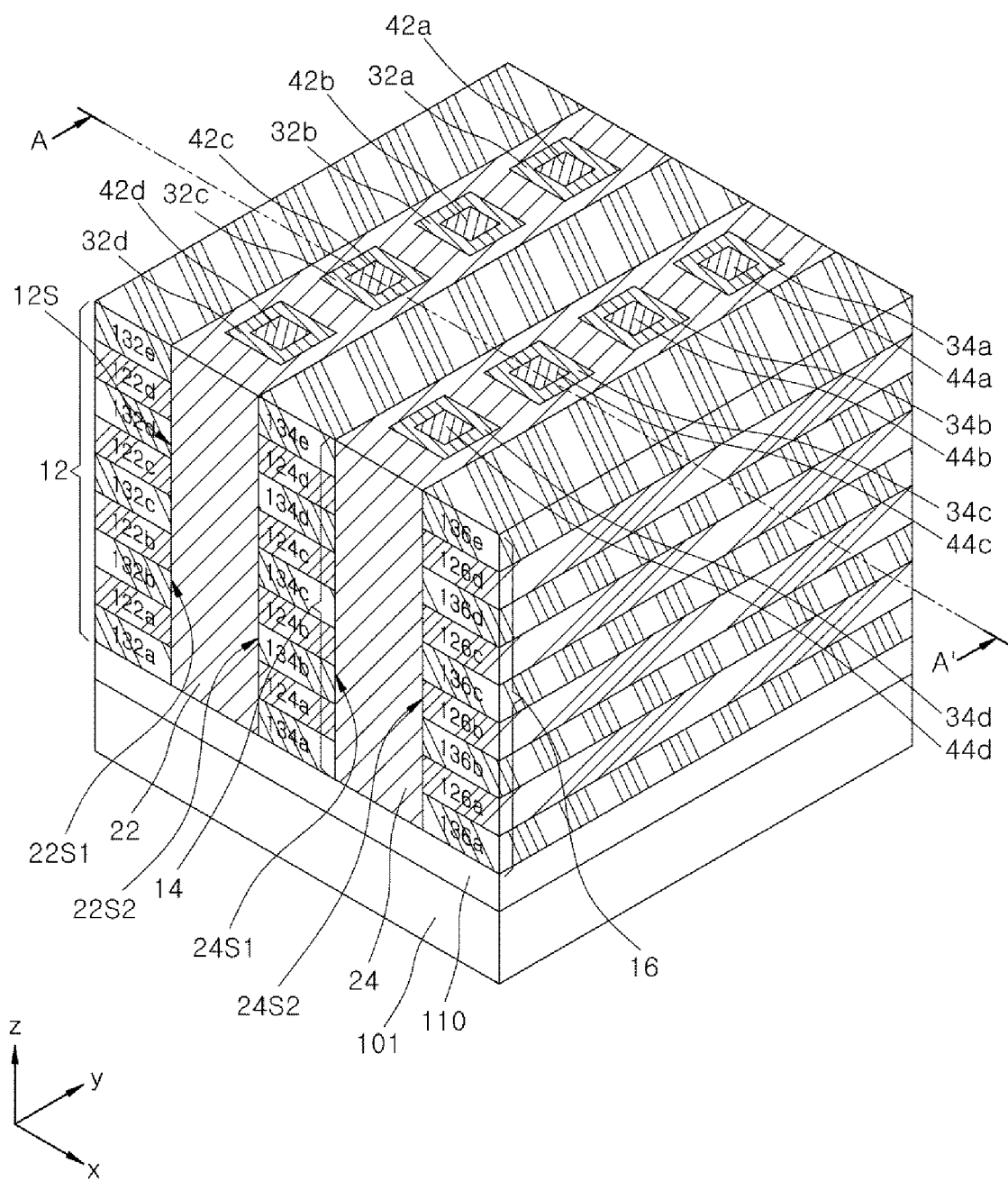
FIG. 1 is a perspective view schematically illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise" or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

In this specification, the term "direction" may mean a direction encompassing a direction parallel to a predetermined direction determined in a coordinate system. As an example, in the x-y-z coordinate system, the z-direction may mean a direction in which the z-axis absolute value increases from the origin 0 in a positive direction along the z-axis and a direction parallel thereto. In addition, the z-direction may mean a direction in which the z-axis absolute value increases from the origin 0 in a negative direction along the z-axis and a direction parallel thereto. The x-direction and the y-direction can be interpreted in substantially the same way, in the x-y-z coordinate system.

Figure 2:
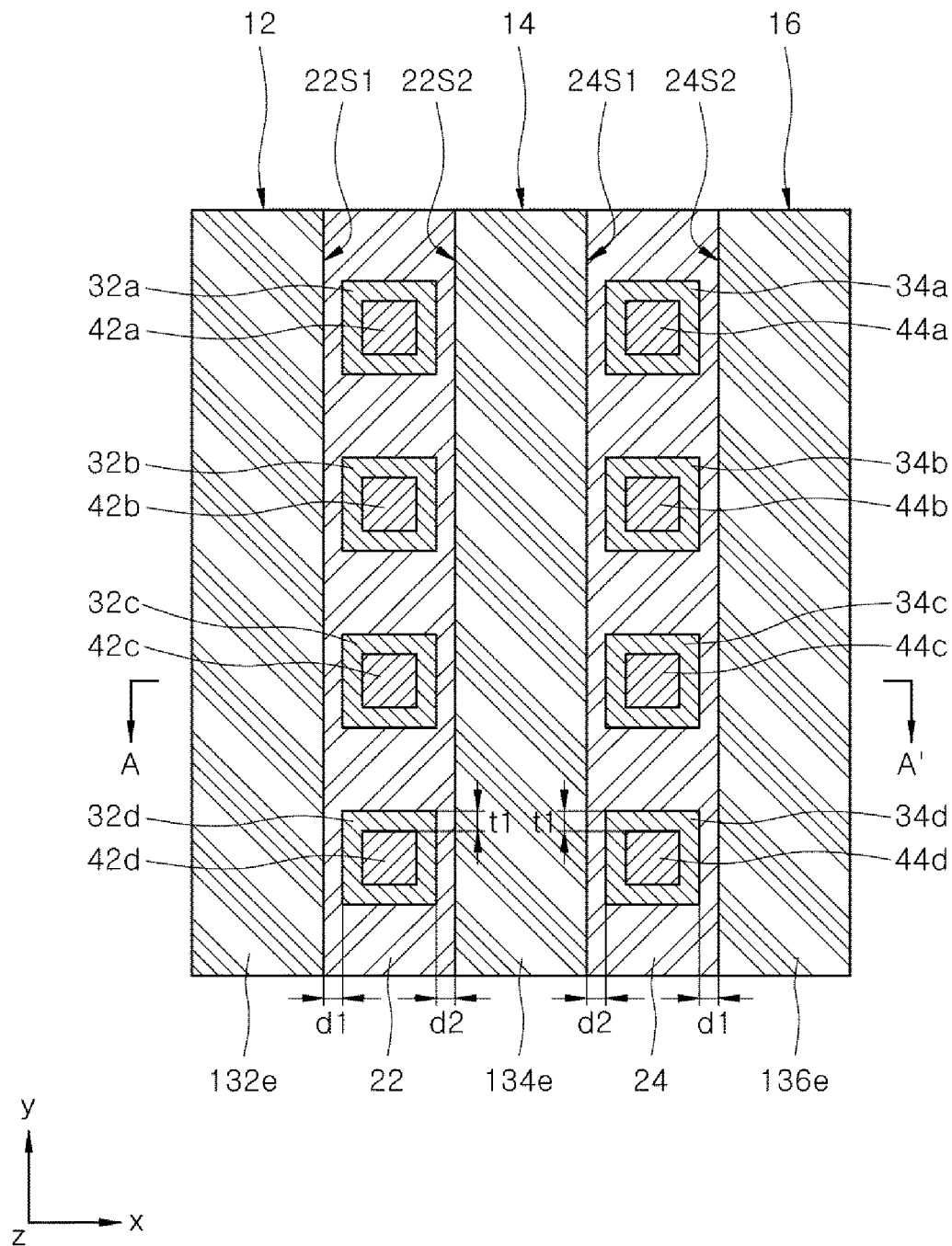
FIG. 2 is a plan view of the nonvolatile memory device of FIG. 1.
Figure 3:
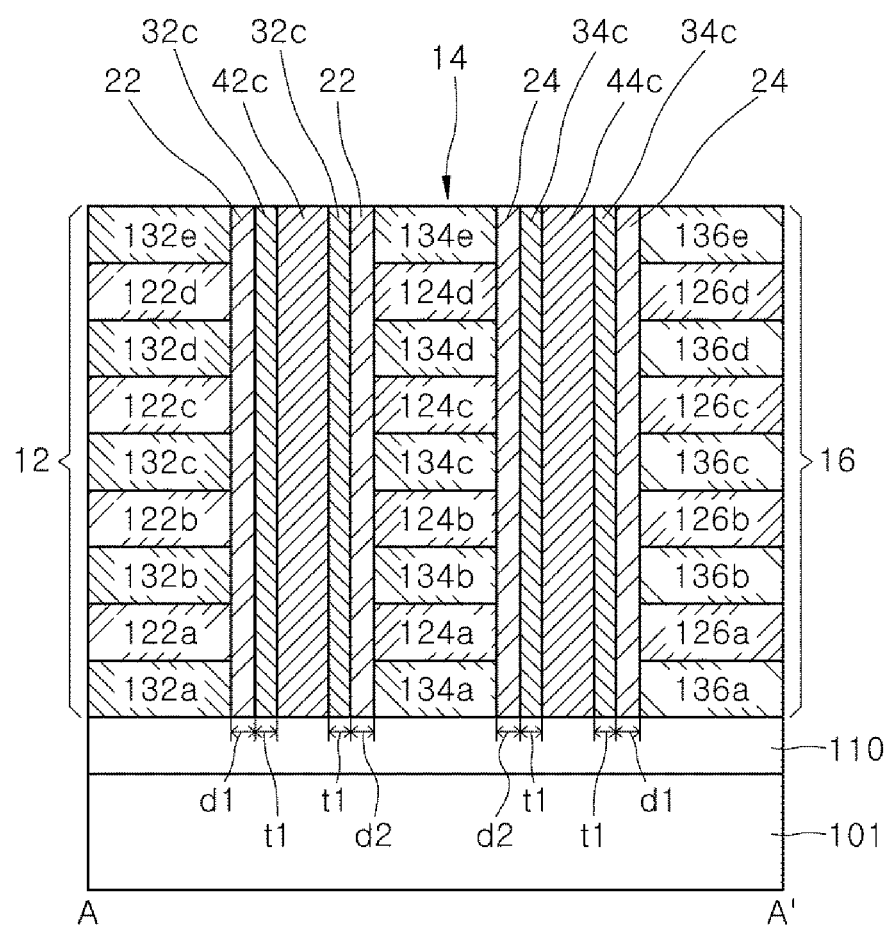
FIG. 3 is a cross-sectional view taken along the line A-A' of the nonvolatile memory device of FIG. 1.

FIG. 1 is a perspective view schematically illustrating a nonvolatile memory device 1 according to an embodiment of the present disclosure. FIG. 2 is a plan view of the nonvolatile memory device of FIG. 1. FIG. 3 is a cross-sectional view taken along the line A-A' of the nonvolatile memory device of FIG. 1.

Referring to FIGS. 1 to 3, the nonvolatile memory device 1 may include a substrate 101, first and second source electrode structures 12 and 16, first and second channel structures 22 and 24, first to eighth ferroelectric structures 32a, 32b, 32c, 32d, 34a, 34b, 34c and 34d, first to eighth gate structures 42a, 42b, 42c, 42d, 44a, 44b, 44c and 44d, and a drain structure 14. In an embodiment, the first and second source electrode structures 12 and 16, the first and second channel structures 22 and 24, and the drain structure 14 may be sequentially disposed over the substrate 101 along the x-direction and may extend along the y-direction as illustrated in FIG. 1. The first and second channel structures 22 and 24, the first to eighth ferroelectric structures 32a, 32b, 32c, 32d, 34a, 34b, 34c and 34d, and the first to eighth gate structures 42a, 42b, 42c, 42d, 44a, 44b, 44c and 44d may each extend along the z-direction. The first to fourth ferroelectric structures 32a, 32b, 32c and 32d and the first to fourth gate structures 42a, 42b, 42c and 42d may be disposed in the first channel structure 22. The fifth to eighth ferroelectric structures 34a, 34b, 34c and 34d and the fifth to eighth gate structures 44a, 44b, 44c and 44d may be disposed in the second channel structure 24.

Meanwhile, in FIGS. 1 to 3, although four ferroelectric structures 32a, 32b, 32c and 32d and four gate electrode structures 42a, 42b, 42c and 42d are disposed in the first channel structure 22 along the y-direction, the numbers of the ferroelectric structures and the gate electrode structures are not necessarily limited to four, but other various numbers are possible. Similarly, the numbers of the ferroelectric structures and the gate electrode structures disposed in the second channel structure 24 along the y-direction are not necessarily limited to four, but other various numbers are possible.

The substrate 101 may include a semiconductor material. Specifically, the semiconductor material may include silicon (Si), germanium (Ge), gallium arsenide (GaAs), and the like. The substrate 101 may be doped with an n-type dopant or a p-type dopant. As an example, the substrate 101 may include a well region doped with an n-type dopant or a p-type dopant.

A base insulation layer 110 may be disposed on the substrate 101. The base insulation layer 110 may insulate the first and second source electrode structures 12 and 16, the first and second channel structures 22 and 24, the first to eighth ferroelectric structures 32a, 32b, 32c, 32d, 34a, 34b, 34c and 34d, the first to eighth gate electrode structures 42a, 42b, 42c, 42d, 44a, 44b, 44c and 44d, and the drain electrode structure 14 from the substrate 101, respectively.

Although not illustrated in FIG. 1, at least one conductive layer and at least one insulation layer may be disposed between the substrate 101 and the base insulation layer 110. The conductive layer and the insulation layer may form various circuit patterns. That is, the conductive layer and the insulation layer may form a plurality of wirings or may constitute a passive element such as a capacitor or a resistor, or an active element such as a diode or a transistor, by way of non-limiting examples.

The first source electrode structure 12 may be disposed on the base insulation layer 110. The first source electrode structure 12 may include first to fourth source electrode layer patterns 122a, 122b, 122c and 122d and first to fifth source insulation layer patterns 132a, 132b, 132c, 132d and 132e, which are alternately stacked on the base insulation layer 110 along the first direction (that is, the z-direction) perpendicular to the substrate 101. The first source insulation layer pattern 132a may be disposed to contact the base insulation layer 110. The fifth source insulation layer pattern 132e may be disposed as an uppermost layer of the first source electrode structure 12.

The first source electrode structure 12 may extend in a second direction (that is, the y-direction) perpendicular to the first direction. The first to fourth source electrode layer patterns 122a, 122b, 122c and 122d may be electrically insulated from each other by the first to fifth source insulation layer patterns 132a, 132b, 132c, 132d and 132e. The first to fourth source electrode layer patterns 122a, 122b, 122c and 122d may be conductive lines extending in the second direction (that is, the y-direction). The first to fourth source electrode layer patterns 122a, 122b, 122c and 122d may each maintain a predetermined potential.

In an embodiment, the first to fourth source electrode layer patterns 122a, 122b, 122c and 122d may each include a conductive material. The conductive material may, for example, include a doped semiconductor layer, metal, conductive metal silicide, conductive metal nitride, conductive metal oxide, and the like. The first to fifth source insulation layer patterns 132a, 132b, 132c, 132d and 132e may each include an insulative material. The insulative material may, for example, include oxide, nitride, oxynitride, and the like.

In some other embodiments, the number of the source electrode layer patterns of the first source electrode structure 12 may not be limited to four. The source electrode layer patterns may be disposed in different various numbers, and the source insulation layer patterns may insulate the various numbers of source electrode layer patterns along the first direction (that is, the z-direction).

Referring to FIGS. 1 to 3, the first channel structure 22 may be disposed on the base insulation layer 110. The first channel structure 22 may extend along the first direction (that is, the z-direction) to have a predetermined height, extend along the second direction (that is, the y-direction) to have a predetermined length, and extend along a third direction (that is, the x-direction) to have a predetermined width.

In an embodiment, the first channel structure 22 may be disposed to contact one sidewall surface 12S of the first source electrode structure 12. In one embodiment, the one sidewall surface 12S may form a plane substantially parallel to the first and second direction (i.e., the z-direction and y-direction). The first channel structure 22 may extend along the second direction (that is, the y-direction) and may be disposed to cover one sidewall surface of each of the first to fourth source electrode layer patterns 122a, 122b, 122c and 122d and one sidewall surface of each of the first to fifth source insulation layer patterns 132a, 132b, 132c, 132d and 132e. The first channel structure 22 may be disposed surround the first to fourth ferroelectric structures 32a, 32b, 32c and 32d and the first to fourth gate electrode structures 42a, 42b, 42c and 42d.

The first channel structure 22 may include a doped semiconductor material or metal oxide. The semiconductor material may, for example, include silicon (Si), germanium (Ge), gallium arsenide (GaAs), and the like. The metal oxide may include indium-gallium-zinc (In—Ga—Zn) oxide. In an embodiment, the first channel structure 22 may include silicon (Si) doped with an n-type dopant. Alternatively, the first channel structure 22 may include c-axis aligned indium-gallium-zinc (In—Ga—Zn) oxide. The first channel structure 22 may have a single crystal or polycrystalline structure.

The first to fourth ferroelectric structures 32a, 32b, 32c and 32d inside the first channel structure 22 may each be disposed in a pillar-like shape extending in the first direction (that is, the z-direction) on the base insulation layer 110. In addition, the first to fourth ferroelectric structures 32a, 32b, 32c and 32d may be disposed to surround or envelop outer surfaces of the first to fourth gate electrode structures 42a, 42b, 42c and 42d having pillar-like shapes. The first to fourth ferroelectric structures 32a, 32b, 32c and 32d may be arranged to be spaced apart from each other along the second direction (i.e., the y-direction) on the base insulation layer 110.

The first to fourth ferroelectric structures 32a, 32b, 32c and 32d may each include a ferroelectric material. The ferroelectric material may have electrical remanent polarization in a state where no external electric field is applied. In addition, in the ferroelectric material, electrical polarization may exhibit hysteresis behavior when an external electric field is applied. By controlling the external electric field, any one of a plurality of stable polarization states on the polarization hysteresis curve can be written in the ferroelectric material. After the external electric field is removed from the ferroelectric material, the written polarization state can be stored in the ferroelectric material in the form of remanent polarization. The remanent polarization may be used to store plural pieces of signal information in a nonvolatile manner. The first to fourth ferroelectric structures 32a, 32b, 32c and 32d may each, for example, include hafnium oxide, zirconium oxide, hafnium zirconium oxide, and the like. The first to fourth ferroelectric structures 32a, 32b, 32c and 32d may each have a crystal structure of an orthorhombic system.

Referring to FIG. 2, the first to fourth ferroelectric structures 32a, 32b, 32c and 32d may be disposed to be spaced apart from a first sidewall surface 22S1 of the first channel structure 22 in the third direction (that is, the x-direction) by a first distance d1, and may be disposed to be spaced apart from a second sidewall surface 22S2 of the first channel structure 22 by a second distance d2 in the third direction (that is, the x-direction). In other words, the first to fourth ferroelectric structures 32a, 32b, 32c and 32d may be spaced apart from the first source electrode structure 12 by the first distance d1, and spaced apart from the drain electrode structure 14 by the second distance d2, in the third direction (that is, the x-direction). In an embodiment, the first distance d1 and the second distance d2 may be the same. In other embodiments, the first distance d1 and the second distance d2 may be different from each other.

The first to fourth gate electrode structures 42a, 42b, 42c and 42d may be disposed inside the first to fourth ferroelectric structures 32a, 32b, 32c and 32d, respectively. The first to fourth gate electrode structures 42a, 42b, 42c and 42d may be disposed to extend in the first direction (i.e., the z-direction) on the base insulation layer 110. The first to fourth gate electrode structures 42a, 42b, 42c and 42d may each have a pillar or pillar-like shape. Accordingly, as illustrated in FIG. 2, the first to fourth gate electrode structures 42a, 42b, 42c and 42d may be disposed to be surrounded by the first to fourth ferroelectric structures 32a, 32b, 32c and 32d by a predetermined thickness t1, as measured outward from sidewall surfaces of the gate electrode structures, as viewed in an x-y plane.

The first to fourth gate electrode structures 42a, 42b, 42c and 42d may be separated from the first channel structure 22 by the first to fourth ferroelectric structures 32a, 32b, 32c and 32d. The first to fourth gate electrode structures 42a, 42b, 42c and 42d may each include a conductive material. The conductive material may, for example, include metal, conductive metal nitride, conductive metal carbide, conductive metal silicide, or conductive metal oxide. The conductive material may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 1 to 3, the drain electrode structure 14 may be disposed on the base insulation layer 110 to contact a second sidewall surface 22S2 of the first channel structure 22. The drain electrode structure 14 may include first to fourth drain electrode layer patterns 124a, 124b, 124c and 124d and first to fifth drain insulation layer patterns 134a, 134b, 134c, 134d and 134e, which are alternately stacked along the first direction (that is, the z-direction). Here, the drain structure 14 may extend in the second direction (that is, the y-direction).

The first to fourth drain electrode layer patterns 124a, 124b, 124c and 124d may be electrically insulated from each other by the first to fifth drain insulation layer patterns 134a, 134b, 134c, 134d and 134e. The first to fourth drain electrode layer patterns 124a, 124b, 124c and 124d may each be a conductive line extending in the second direction (that is, the y-direction). The first to fourth drain electrode layer patterns 124a, 124b, 124c and 124d may each maintain a predetermined potential. As an example, during the operation of the nonvolatile memory device 1, the potentials of the first to fourth drain electrode layer patterns 124a, 124b, 124c and 124d may be different from the potentials of the first to fourth source electrode layer patterns 122a, 122b, 122c and 122d of the first source electrode structure 12, and from the potentials of the first to fourth source electrode layer patterns 126a, 126b, 126c and 126d of the second source electrode structure 16.

In an embodiment, any one of the first to fourth source electrode layer patterns 122a, 122b, 122c and 122d and any one of the first to fourth drain electrode layer patterns 124a, 124b, 124c and 124d may be disposed at positions corresponding to each other on the same plane or substantially the same horizontal (x-y) plane. As an example, the first source electrode layer pattern 122a and the first drain electrode layer pattern 124a may be disposed opposite to each other, and at substantially the same vertical location on either side of the first channel structure 22. In the same manner, any one of the second to fourth source electrode layer patterns 122b, 122c and 122d and any one of the second to fourth drain electrode layer patterns 124b, 124c and 124d may be disposed at the same level on opposite sides of the first channel structure 22.

In an embodiment, the first to fourth drain electrode layer patterns 124a, 124b, 124c and 124d may each include a conductive material. The conductive material may, for example, include a doped semiconductor material, metal, conductive metal silicide, conductive metal nitride, conductive metal oxide, and the like. The first to fifth drain insulation layer patterns 134a, 134b, 134c, 134d and 134e may each include an insulative material. The insulative material may, for example, include oxide, nitride, oxynitride, and the like.

In some other embodiments, if the number of the source electrode layer patterns of the first and second source electrode structures 12 and 16 is not limited to four, then the drain electrode layer patterns of the drain electrode structure 14 may also be arranged in the same number as the number of the source electrode layer patterns. In this case, the drain insulation layer patterns may be disposed in a predetermined number to insulate the various numbers of the drain electrode layer patterns along the first direction (that is, the z-direction).

Referring to FIGS. 1 to 3, the second channel structure 24 may be disposed on the base insulation layer 110 and contact a sidewall surface of the drain electrode structure 14. A first sidewall surface 24S1 of the second channel structure 24 may be disposed to cover or co-extend with the sidewall surface of the drain electrode structure 14. The second channel structure 24 may be disposed to surround or envelop outer surfaces of each of the fifth to eighth ferroelectric structures 34a, 34b, 34c and 34d, which in turn surrounds or envelops the fifth to eighth gate electrode structures 44a, 44b, 44c and 44d, respectively. The configuration of the second channel structure 24 may be substantially the same as the configuration of the first channel structure 22.

The fifth to eighth ferroelectric structures 34a, 34b, 34c and 34d may each be disposed in a pillar-like shape extending in the first direction (i.e., the z-direction) on the base insulation layer 110. The fifth to eighth ferroelectric structures 34a, 34b, 34c and 34d may be arranged to be spaced apart from each other on the base insulation layer 110 along the second direction (i.e., the y-direction).

In addition, the fifth to eighth gate electrode structures 44a, 44b, 44c and 44d may each be disposed inside the corresponding fifth to eighth ferroelectric structures 34a, 34b, 34c and 34d. The fifth to eighth gate electrode structures 44a, 44b, 44c and 44d may each be disposed in a pillar-like shape extending in the first direction (i.e., the z-direction) on the base insulation layer 110. Accordingly, as illustrated in FIG. 2, the fifth to eighth ferroelectric structures 34a, 34b, 34c and 34d may be disposed to surround the fifth to eighth gate electrode structures 44a, 44b, 44c and 44d, respectively, by a predetermined thickness t1, as measured outward from sidewall surfaces of the gate electrode structures, as viewed in an x-y plane.

Referring to FIG. 2, the fifth to eighth ferroelectric structures 34a, 34b, 34c and 34d may be disposed to be spaced apart from the first sidewall surface 24S1 of the second channel structure 24 in the third direction (i.e., the x-direction) by a second distance d2 and may be disposed to be spaced apart from the second sidewall surface 24S2 of the second channel structure 24 in the third direction (i.e., the x-direction) by a first distance d1. In other words, the fifth to eighth ferroelectric structures 34a, 34b, 34c and 34d may be spaced apart from the drain electrode structure 14 by the second distance d2 and may be spaced apart from the second source electrode structure 16 by the first distance d1, in the third direction (i.e., the x-direction). In an embodiment, the first distance d1 and the second distance d2 may be the same. In other embodiments, the first distance d1 and the second distance d2 may be different from each other. The configurations of the fifth to eighth ferroelectric structures 34a, 34b, 34c and 34d may be substantially the same as the configurations of the first to fourth ferroelectric structures 32a, 32b, 32c and 32d.

The fifth to eighth gate electrode structures 44a, 44b, 44c and 44d may be separated from the second channel structure 24 by the fifth to eighth ferroelectric structures 34a, 34b, 34c and 34d. The configurations of the fifth to eighth gate electrode structures 44a, 44b, 44c and 44d may be substantially the same as the configurations of the first to fourth gate electrode structures 42a, 42b, 42c and 42d.

Referring to FIGS. 1 to 3, the second source electrode structure 16 may be disposed on the base insulation layer 110 and arranged to contact a second sidewall surface 24S2 of the second channel structure 24. The second source electrode structure 16 may include first to fourth source electrode layer patterns 126a, 126b, 126c and 126d and first to fifth source insulation layer patterns 136a, 136b, 136c, 136d and 136e which are alternately stacked along the first direction (i.e., the z-direction). Here, the second source electrode structure 16 may extend in the second direction (i.e., the y-direction) perpendicular to the first direction.

The first to fourth source electrode layer patterns 126a, 126b, 126c and 126d may be electrically insulated from each other by the first to fifth source insulation layer patterns 136a, 136b, 136c, 136d and 136e. The first to fourth source electrode layer patterns 126a, 126b, 126c and 126d may each be a conductive line extending in the second direction (i.e., the y-direction). The first to fourth source electrode layer patterns 126a, 126b, 126c and 126d may each maintain a predetermined potential.

In an embodiment, the configurations of the first to fourth source electrode layer patterns 126a, 126b, 126c and 126d of the second source electrode structure 16 may be substantially the same as the configurations of the first to fourth source electrode layer patterns 122a, 122b, 122c and 122d of the first source electrode structure 12. In addition, the configurations of the first to fifth source insulation layer patterns 136a, 136b, 136c, 136d and 136e of the second source electrode structure 16 may be substantially the same as the configurations of the first to fifth source insulation layer patterns 132a, 132b, 132c, 132d and 132e of the first source electrode structure 12.

Referring again to FIGS. 1 to 3, the first and second channel structures 22 and 24 and the first and second source electrode structures 12 and 16 may be symmetrically disposed with respect to each other across a y-z plane centered on the drain electrode structure 14. Similarly, the first to fourth ferroelectric structures 32a, 32b, 32c and 32d and the fifth to eighth ferroelectric structures 34a, 34b, 34c and 34d may be symmetrically disposed with respect to each other across the drain electrode structure 14. In addition, the first to fourth gate electrode structures 42a, 42b, 42c and 42d and the fifth to eighth gate electrode structures 44a, 44b, 44c and 44d may be symmetrically disposed with respect to each other across the drain electrode structure 14.

Referring to FIGS. 1 and 2, the first to fourth ferroelectric structures 32a, 32b, 32c and 32d and the first to fourth gate electrode structures 42a, 42b, 42c and 42d may be arranged in the second direction (i.e., the y-direction). The first source electrode structure 12 and the drain electrode structure 14 may extend in the second direction (i.e., the y-direction) to cover or to extend beyond the first to fourth ferroelectric structures 32a, 32b, 32c and 32d and the first to fourth gate electrode structures 42a, 42b, 42c and 42d, respectively. Similarly, the fifth to eighth ferroelectric structures 34a, 34b, 34c and 34d and the fifth to eighth gate electrode structures 44a, 44b, 44c and 44d may be arranged in the second direction (i.e., the y-direction). The second source electrode structure 16 and the drain electrode structure 14 may be disposed to cover or to extend beyond the fifth to eighth ferroelectric structures 34a, 34b, 34c and 34d and the fifth to eighth gate electrode structures 44a, 44b, 44c and 44d.

Figure 4:
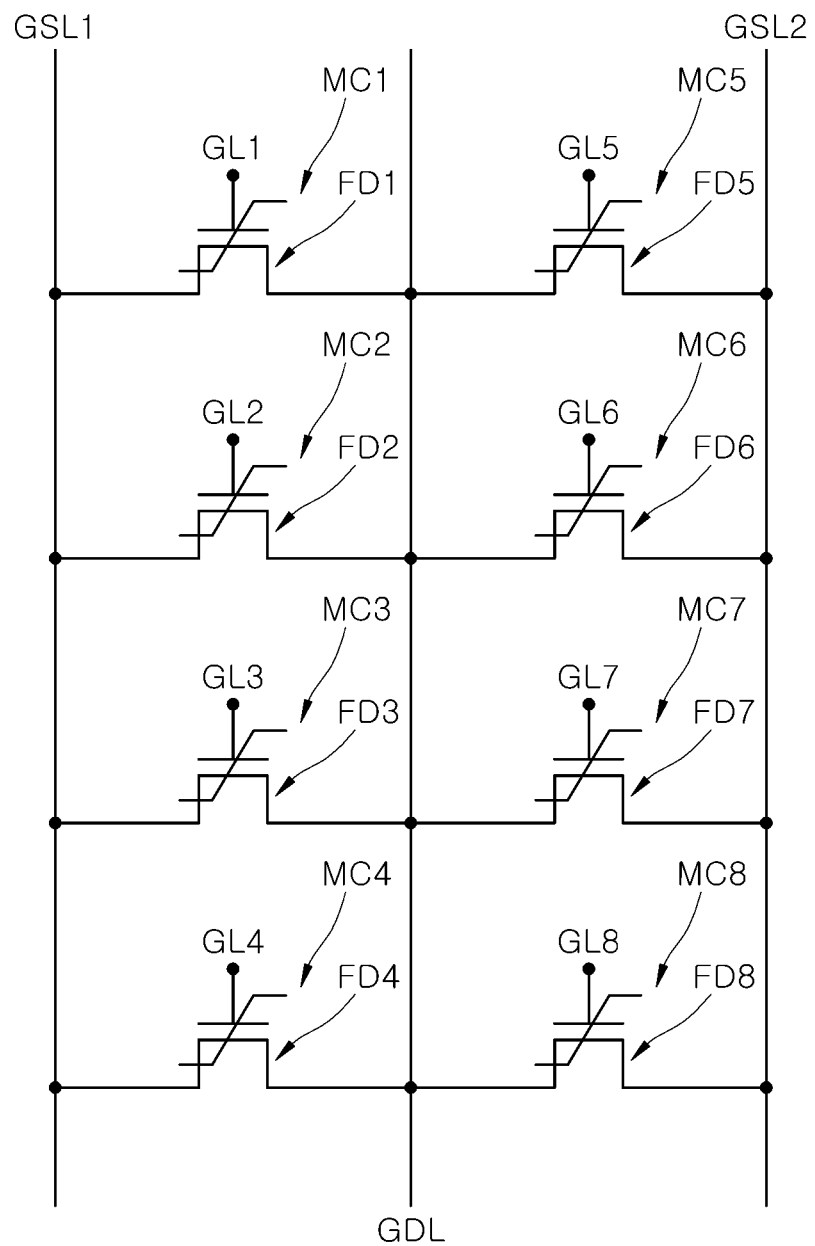
FIG. 4 is a circuit diagram schematically illustrating a nonvolatile memory device according to an embodiment of the present disclosure.

FIG. 4 is a circuit diagram schematically illustrating a nonvolatile memory device according to an embodiment of the present disclosure. The circuit diagram of FIG. 4 may correspond to a portion of the configuration of the nonvolatile memory device 1 described above with reference FIGS. 1 to 3.

Referring to FIG. 4, first to eighth memory cells MC1, MC2, MC3, MC4, MC5, MC6, MC7 and MC8 are disclosed. Each of the first to eighth memory cells MC1, MC2, MC3, MC4, MC5, MC6, MC7 and MC8 may have a form of a transistor and may include first to eighth ferroelectric layers FD1, FD2, FD3, FD4, FD5, FD6, FD7 and FD8 functioning as memory layers.

The first to fourth memory cells MC1, MC2, MC3 and MC4 may be each electrically connected to a first global source line GSL1 and a global drain line GDL, and the fifth to eighth memory cells MC5, MC6, MC7 and MC8 may be each electrically connected to a second global source line GSL2 and the global drain line GDL. Gate electrodes of the first to eighth memory cells MC1, MC2, MC3, MC4, MC5, MC6, MC7 and MC8 may be connected to first to eighth word lines GL1, GL2, GL3, GL4, GL5, GL6, GL7 and GL8, respectively.

At least one of the first to eighth word lines GL1, GL2, GL3, GL4, GL5, GL6, GL7 and GL8 may be selected. Through the selected word line, a polarization switching voltage having a magnitude equal to or greater than a predetermined threshold voltage may be applied across the corresponding first to eighth ferroelectric layers FD1, FD2, FD3, FD4, FD5, FD6, FD7 and FD8 of the selected first to eighth memory cells MC1, MC2, MC3, MC4, MC5, MC6, MC7 and MC8. By applying a polarization switching voltage, polarization of the first to eighth ferroelectric layers FD1, FD2, FD3, FD4, FD5, FD6, FD7 and FD8 may be switched into a predetermined direction. After the polarization switching voltage is removed, the switched polarization may be stored in the corresponding first to eighth ferroelectric layers FD1, FD2, FD3, FD4, FD5, FD6, FD7 and FD8 in the form of remanent polarization. As described above, by the polarization switching voltage applied through at least one of the first to eighth word lines GL1, GL2, GL3, GL4, GL5, GL6, GL7 and GL8, a write operation may be performed on at least one of the first to eighth memory cells MC1, MC2, MC3, MC4, MC5, MC6, MC7 and MC8. After the write operation is completed, a predetermined signal may be stored in the corresponding memory cell in a nonvolatile manner.

Meanwhile, an operation of reading out the signal nonvolatilely stored in the first to eighth memory cells MC1, MC2, MC3, MC4, MC5, MC6, MC7 and MC8 may be performed as follows. As an exemplary example, a process of reading a signal stored in the second memory cell MC2 will be described. A read voltage equal to or greater than a predetermined threshold voltage is applied to the gate electrode of the second memory cell MC2 through the second word line GL2. An absolute value of the read voltage may be smaller than an absolute value of the switching polarization voltage. That is, the polarization inside the second ferroelectric layer FD2 may not be switched by the read voltage, however a transistor of the second memory cell MC2 may be turned on by the read voltage and a channel layer may be formed in the transistor. In this case, when a source-drain potential difference is formed between the first global source line GSL1 and the global drain line GDL, a source-drain current may flow through the channel layer.

The source-drain current may vary according to the orientation and magnitude of the remanent polarization stored in the second ferroelectric layer FD2. As an example, when the remanent polarization is oriented from the gate electrode toward the channel layer, positive charges are accumulated in the second ferroelectric layer FD2 adjacent to the channel layer, thereby increasing the electron density of the channel layer. Accordingly, the magnitude of the current flowing along the channel layer may increase. As another example, when the remanent polarization is oriented from the channel layer toward the gate electrode, negative charges are accumulated in the second ferroelectric layer FD2 adjacent to the channel layer, thereby decreasing the electron density of the channel layer. Accordingly, the magnitude of the current flowing along the channel layer may decrease. As described above, the signal stored in the memory cell can be read by turning on the transistor of the memory cell to be read and measuring the current flowing through the channel layer.

In other embodiments, the number of the memory cells disposed between the first global source line GSL1 and the global drain line GDL is not necessarily limited to four, and various other numbers are possible. Similarly, the number of the memory cells disposed between the second global source line GSL2 and the global drain line GDL is also not necessarily limited to four, and various other numbers are possible. Accordingly, the number of the word lines is also not necessarily limited to eight, and various other numbers are possible.

Meanwhile, comparing FIG. 4 with FIGS. 1 to 3, the first global source line GSL1 may correspond to one of the first to fourth source electrode layer patterns 122a, 122b, 122c and 122d of the first source electrode structure 12. In other words, in an embodiment of FIGS. 1 to 3, the nonvolatile memory device 1 may include a plurality of first global source lines that are separated from each other.

Meanwhile, the global drain line GDL may be one of the first to fourth drain electrode layer patterns 124a, 124b, 124c and 124d of the drain electrode structure 14. In other words, in an embodiment of FIGS. 1 to 3, the nonvolatile memory device 1 may include a plurality of global drain lines that are separated from each other.

In addition, the one of the first to fourth source electrode layer patterns 122a, 122b, 122c and 122d and the one of the first to fourth drain electrode layer patterns 124a, 124b, 124c and 124d may be symmetrically disposed with respect to the first channel structure 22 on the same plane. As an example, when the first global source line GSL1 is the fourth source electrode layer pattern 122d, the global drain line GDL may be the fourth drain electrode layer pattern 124d. Similarly, when the first global source line GSL1 is one of the first to third source electrode layer patterns 122a, 122b and 122c, the global drain line GDL may correspond to one of the first to third drain electrode layer patterns 124a, 124b and 124c.

In the same way, the second global source line GSL2 may correspond to one of the first to fourth source electrode layer patterns 126a, 126b, 126c and 126d of the second source electrode structure 16. In other words, in an embodiment of FIGS. 1 to 3, the nonvolatile memory device 1 may include a plurality of second global source lines that are separated from each other.

In this case, the one of the first to fourth source electrode layer patterns 126a, 126b, 126c and 126d and the one of the first to fourth drain electrode layer patterns 124a, 124b, 124c and 124d may be symmetrically disposed with respect to the second channel structure 24 on the same plane. As an example, when the second global source line GSL2 is the fourth source electrode layer pattern 126d, the global drain line GDL may be the fourth drain electrode layer pattern 124d. Similarly, when the second global source line GSL2 is one of the first to third source electrode layer patterns 126a, 126b and 126c, the global drain line GDL may be corresponding one of the first to third drain electrode layer patterns 124a, 124b and 124c.

Meanwhile, the first to eighth word lines GL1, GL2, GL3, GL4, GL5, GL6, GL7 and GL8 of FIG. 4 may correspond to the first to eighth gate electrode structures 42a, 42b, 42c, 42d, 44a, 44b, 44c and 44d of FIGS. 1 to 3, respectively. In addition, the first to eighth ferroelectric layers FD1, FD2, FD3, FD4, FD5, FD6, FD7 and FD8 of FIG. 4 may correspond to the first to eighth ferroelectric structures 32a, 32b, 32c, 32d, 34a, 34b, 34c and 34d of FIGS. 1 to 3, respectively.

As described above, at least one piece of signal information can be written in the first to eighth memory cells MC1, MC2, MC3, MC4, MC5, MC6, MC7 and MC8 by selecting at least one of the first to eighth word lines GL1, GL2, GL3, GL4, GL5, GL6, GL7 and GL8 and by independently applying the polarization switching voltage. In addition, the signal information stored in the corresponding memory cell can be read by selecting at least one of the first to eighth word lines GL1, GL2, GL3, GL4, GL5, GL6, GL7 and GL8 and applying the read voltage to form a source-drain potential difference between one of the first and second global source lines GSL1 and GSL2 and the global drain line GDL. As such, according to an embodiment of the present disclosure, random access to one of the first to eighth memory cells MC1, MC2, MC3, MC4, MC5, MC6, MC7 and MC8 is possible, and a write operation or a read operation may be performed on the randomly accessed memory cell.

FIGS. 5A to 5D are views schematically illustrating a driving method of a nonvolatile memory device according to an embodiment of the present disclosure. FIGS. 5A to 5D are plan views of a plane perpendicular to the z-direction of the nonvolatile memory device 1 described above with reference to FIGS. 1 to 3. Referring to FIGS. 1 and 5A to 5D together, the first to fourth source electrode layer patterns 122a, 122b, 122c and 122d of the first source electrode structure 12 and the corresponding first to fourth drain electrode layer patterns 124a, 124b, 124c and 124d of the drain structure 14, and the first to fourth source electrode layer patterns 126a, 126b, 126c and 126d of the second source electrode structure 16 and the corresponding first to fourth drain electrode layer patterns 124a, 124b, 124c and 124d of the drain structure 14, may form eight memory cells, that is, the first to eighth memory cells MC1, MC2, MC3, MC4, MC5, MC6, MC7 and MC8 along the first direction (i.e., the z-direction) distributed on four different levels, which for convenience of description will be described as planes.

Figure 5A:
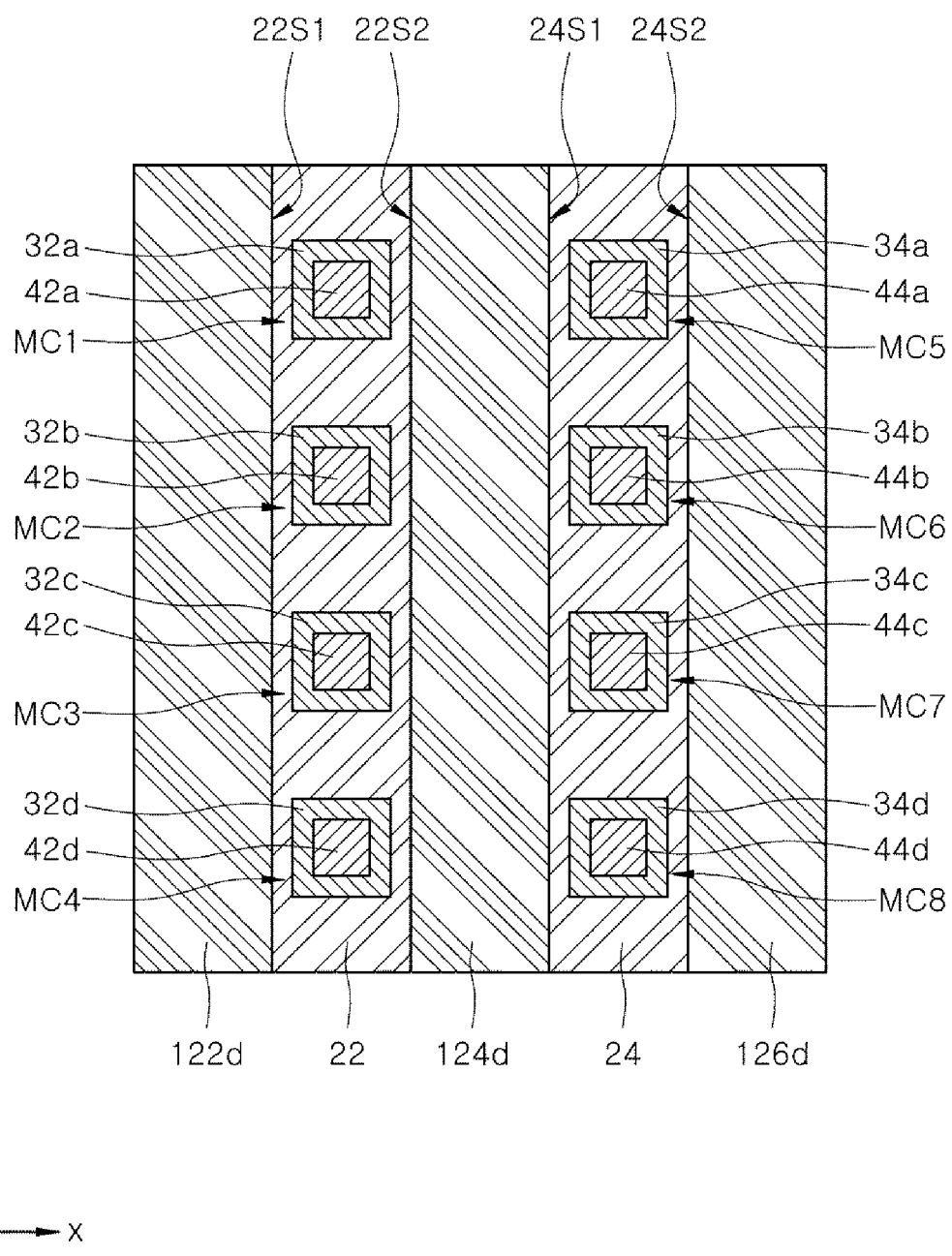
FIGS. 5A to 5D are views schematically illustrating a driving method of a nonvolatile memory device according to an embodiment of the present disclosure.
Figure 5B:
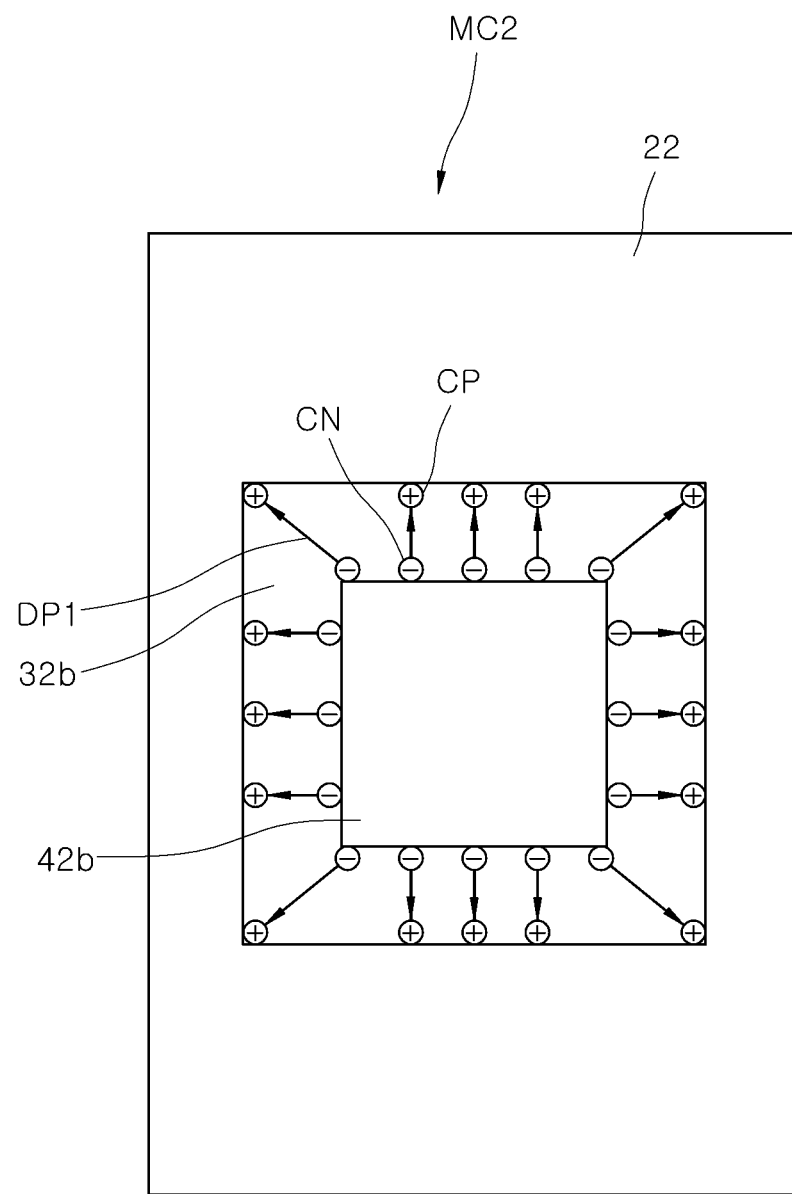
Figure 5C:
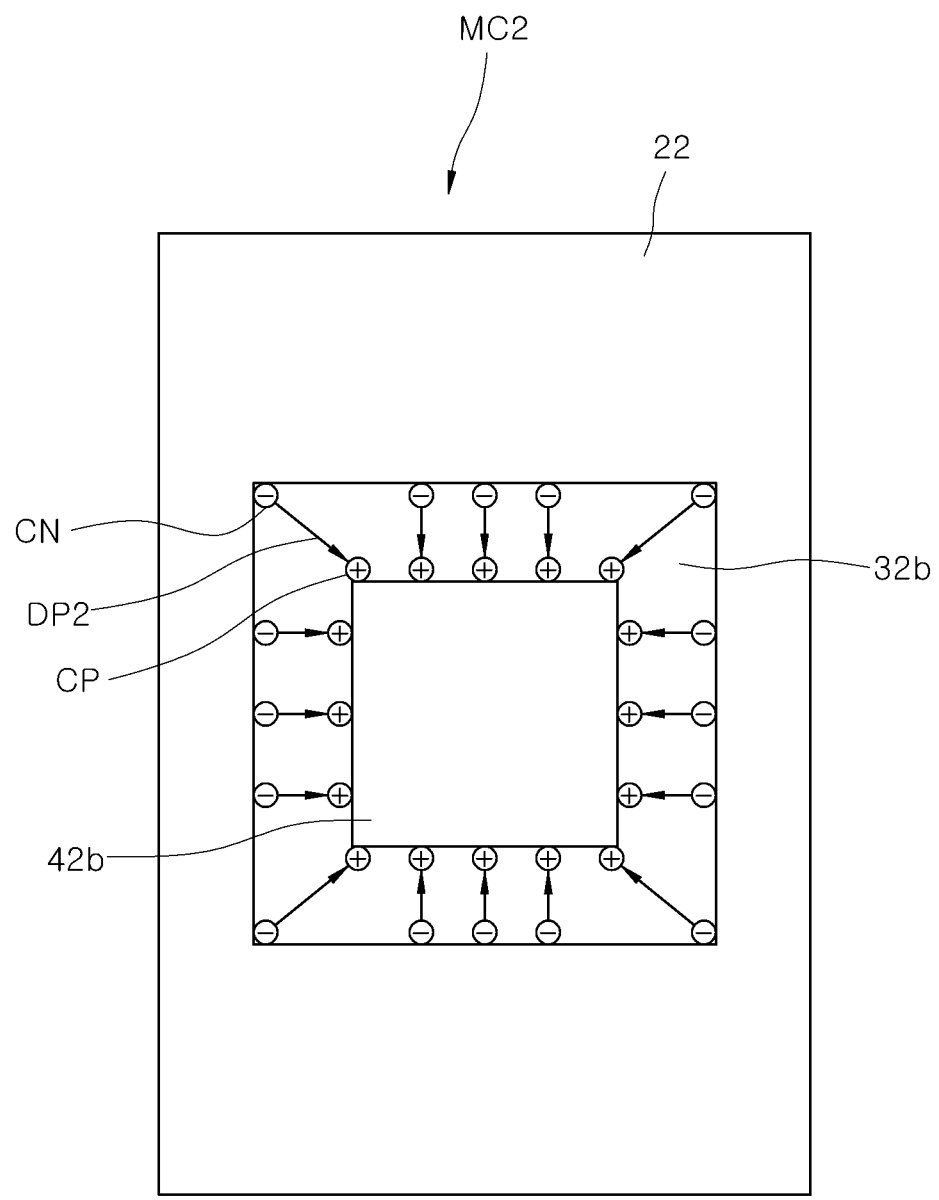
Figure 5D:
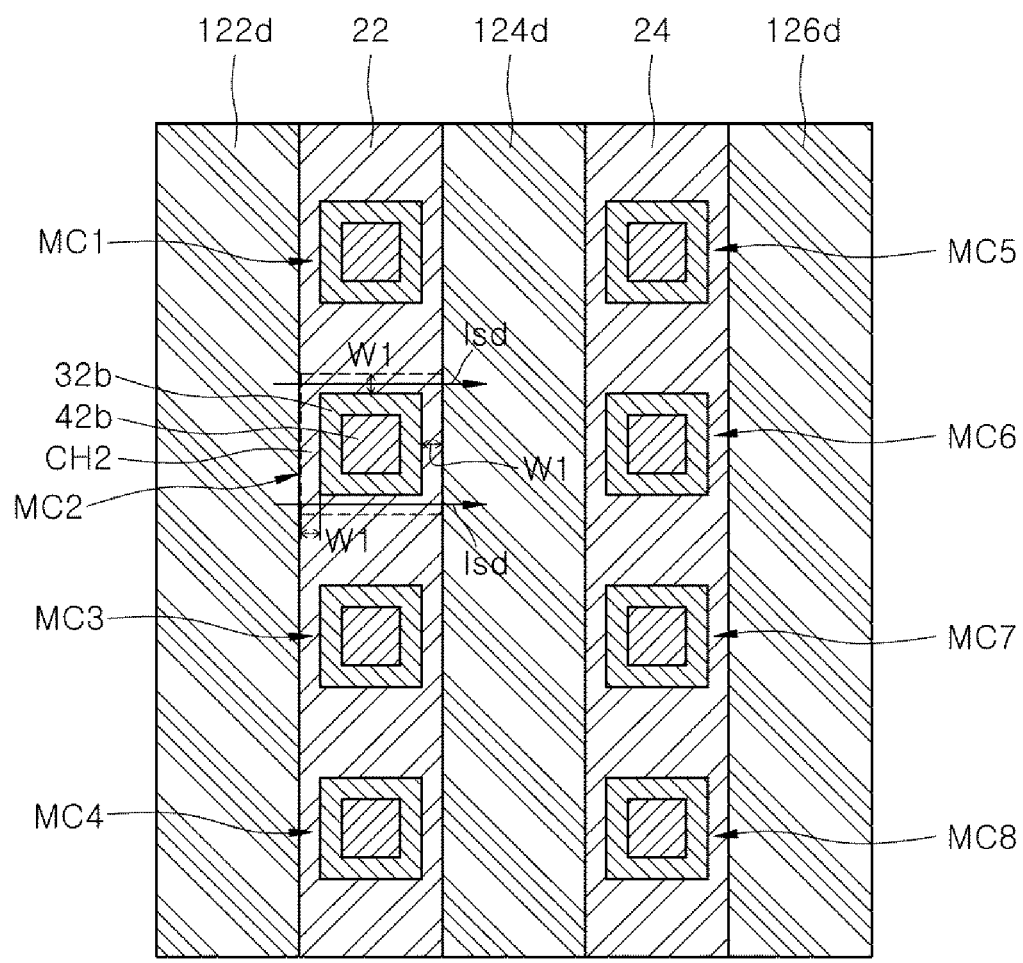

FIGS. 5A and 5D illustrate the first to eighth memory cells MC1, MC2, MC3, MC4, MC5, MC6, MC7 and MC8 formed by the fourth source electrode layer pattern 122d of the first source electrode structure 12, the fourth drain electrode layer pattern 124d of the drain electrode structure 14, and the fourth source layer pattern 126d of the second source electrode structure 16 on the uppermost plane of the four different planes in cross sections of the first and second channel structures 22 and 24. In addition, FIGS. 5A and 5D illustrate the first to eighth ferroelectric structures 32a, 32b, 32c, 32d, 34a, 34b, 34c and 34d and the first to eighth gate electrode structures 42a, 42b, 42c, 42d, 44a, 44b, 44c and 44d respectively corresponding to the first to eighth memory cells MC1, MC2, MC3, MC4, MC5, MC6, MC7 and MC8. As a detailed example, FIGS. 5B and 5C are enlarged perspective views of the second memory cell MC2 of FIGS. 5A and 5D.

Hereinafter, a driving method of the second memory cell MC2 constituted by the fourth source electrode layer pattern 122d of the first source electrode structure 12, the fourth drain electrode layer pattern 124d of the drain electrode structure 14, the first channel structure 22, the second ferroelectric structure 32b and the second gate electrode structure 42b will be described in detail. However, the driving methods of the first memory cell MC1 and the third to eighth memory cells MC3, MC4, MC5, MC6, MC7 and MC8, which are not described in detail, are substantially the same. Likewise, the driving methods of other memory cells formed by the first to third source electrode layer patterns 122a, 122b and 122c of the first source electrode structure 12 and the corresponding first to third drain electrode layer patterns 124a, 124b and 124c of the drain electrode structure 14, and the first to third source electrode layer patterns 126a, 126b and 126c of the second source electrode structure 16 and the corresponding drain electrode layer patterns 124a, 124b and 124c of the drain electrode structure 14 on three different planes are also substantially the same.

For a write operation for the second memory cell MC2, the second gate electrode structure 42b may be selected. A polarization switching voltage having an absolute value equal to or greater than a predetermined threshold voltage may be applied to the second gate electrode structure 42b to switch the polarization inside the second ferroelectric structure 32b.

As an example, while the first channel structure 22 is grounded, a polarization switching voltage having a positive polarity may be applied to the second gate electrode structure 42b. When the polarization switching voltage is applied, the polarization orientation inside the second ferroelectric structure 32b may change. In this example, the second memory cell MC2 is adjacent to the fourth source electrode layer pattern 122d of the first source electrode structure 12 and the fourth drain electrode layer pattern 124d of the drain electrode structure 14, so that the fourth source electrode layer pattern 122d and the fourth drain electrode layer 124d may be grounded while the polarization switching voltage is applied. A predetermined voltage may also be applied to the first to third source electrode layer patterns 122a, 122b and 122c and the first to third drain electrode layer patterns 124a, 124b and 124c. As an example, the predetermined voltage may be a voltage substantially equal to the polarization switching voltage. As another example, the predetermined voltage may be a voltage greater than the ground voltage and smaller than the polarization switching voltage. Accordingly, polarization orientation may be changed by the polarization switching voltage only in the region of the second ferroelectric structure 32b corresponding to the second memory cell MC2.

In the plan view of FIG. 5B, when the polarization switching voltage is applied, a first polarization DP1 oriented from an interface region of the second ferroelectric structure 32b contacting the second gate electrode structure 42b toward an interface region of the second ferroelectric structure 32b contacting the first channel structure 22 may be formed. Even after the polarization switching voltage is removed, the first polarization DP1 may be stored in the form of remanent polarization. Positive charges CP and negative charges CN may be generated inside the second ferroelectric structure 32b by the first polarization DP1. Even after the polarization switching voltage is removed, the positive charges CP may be distributed in the interface region of the ferroelectric structure 32b in contact with the first channel structure 22, and the negative charges CN may be distributed in the interface region of the ferroelectric structure 32b in contact with the second gate electrode structure 42b.

As another example, while the first channel structure 22 is grounded, a polarization switching voltage having a negative polarity may be applied to the second gate electrode structure 42b. Accordingly, the polarization orientation inside the second ferroelectric structure 32b may change. Similarly, in this example, the second memory cell MC2 is adjacent to the fourth source electrode layer pattern 122d of the first source electrode structure 12 and the fourth drain electrode layer pattern 124d of the drain electrode structure 14, so that the fourth source electrode layer pattern 122d and the fourth drain electrode layer pattern 124d may be grounded while the polarization switching voltage is applied. A predetermined voltage may also be applied to the first to third source electrode layer patterns 122a, 122b and 122c and the first to third drain electrode layer patterns 124a, 124b and 124c. As an example, the predetermined voltage may be a voltage substantially equal to the polarization switching voltage. As another example, an absolute value of the predetermined voltage may be greater than an absolute value of the ground voltage and smaller than an absolute value of the polarization switching voltage.

In the plan view of FIG. 5C, when the polarization switching voltage having a negative polarity is applied, a second polarization DP2 oriented from the interface region of the second ferroelectric structure 32b contacting the first channel structure 22 toward the interface region of the second ferroelectric structure 32b contacting the second gate electrode structure 42b may be formed. Even after the polarization switching voltage having a negative polarity is removed, the second polarization DP2 may be stored in the form of remanent polarization. The second polarization DP2 may generate negative charges CN in the interface region of the second ferroelectric structure 32b contacting the first channel structure 22, and positive charges CP may be generated in the interface region of the second ferroelectric structure 32b contacting the second gate electrode structure 42b. Even after the polarization switching voltage is removed, the generated positive charges CP and the negative charges CN may be distributed in the corresponding interface regions, respectively.

As described above, a writing operation may be performed through the switching operation of the polarization orientation of the second ferroelectric structure 32b described above with reference to FIGS. 5B and 5C. As an example, the first polarization DP1 forming operation related to FIG. 5B may be referred to as a program operation, and the second polarization DP2 forming operation related to FIG. 5C may be referred to as an erase operation.

A read operation for signal information stored in the second memory cell MC2 will be described in detail with reference to FIG. 5D. First, the second gate electrode structure 42b may be selected. Subsequently, a read voltage having an absolute value equal to or greater than a predetermined threshold voltage may be applied to the second gate electrode structure 42b. The absolute value of the read voltage may be smaller than the absolute value of the polarization switching voltage. That is, the polarization inside the second ferroelectric layer FD2 may not be switched by the read voltage.

However, a channel layer CH2 may be formed, in the first channel structure 22 adjacent to the second ferroelectric structure 32b, by the read voltage. The electron density inside the channel layer CH2 may be higher than the electron density outside the channel layer CH2. The channel layer CH2 may be formed to have a first width W1 measured from an outer surface of the second ferroelectric structure 32b. The first width W1 may be substantially the same as the first distance d1 or the second distance d2 described above with reference to FIGS. 2 and 3.

After the channel layer CH2 is formed, a source-drain potential difference may be formed between the fourth source electrode layer pattern 122d and the fourth drain electrode layer pattern 124d. As an example, after the fourth source electrode layer pattern 122d is grounded, a drain voltage having a positive polarity may be applied to the fourth drain electrode layer pattern 124d. Accordingly, electrons may flow from the fourth source electrode layer pattern 122d to the fourth drain electrode layer pattern 124d via the channel layer CH2. The electron flow is shown as "Isd" in FIG. 5D. At this time, the current density generated by the flow of electrons may be influenced by the orientation of the remanent polarization stored in the second ferroelectric structure 32b. When the orientation of the remanent polarization is the same as the orientation of the first polarization DP1 of FIG. 5B, the electron density in the channel layer CH2 increases, so that the current density flowing along the channel layer CH2 may increase. Conversely, when the orientation of the remanent polarization is the same as that of the second polarization DP2 of FIG. 5C, the electron density in the channel layer CH2 decreases, so that the current density flowing along the channel layer CH2 may decrease. As described above, the signal stored in the memory cell can be read by forming a channel layer surrounding the ferroelectric structure of the memory cell to be read and then measuring the current flowing through the channel layer.

Figure 6:
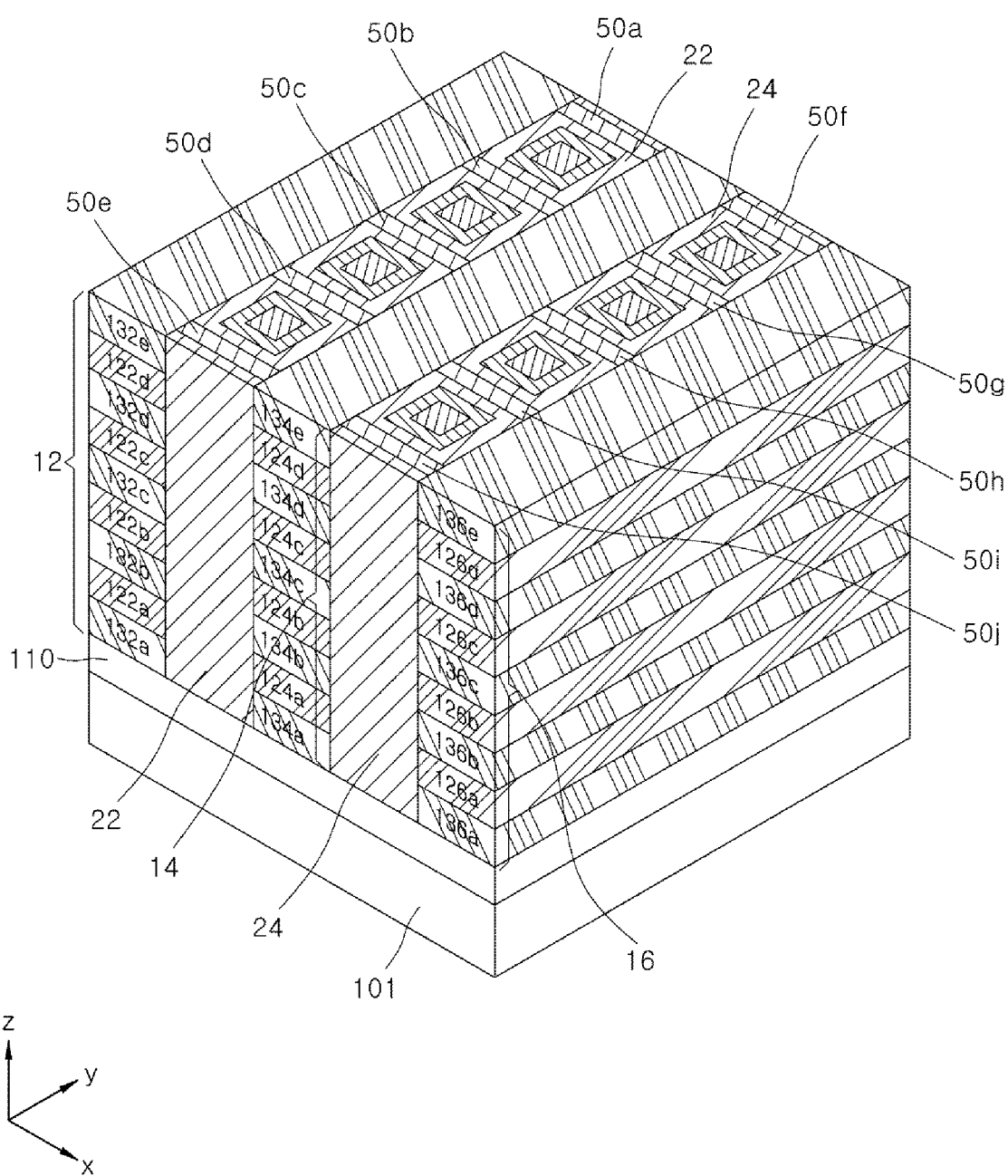
FIG. 6 is a perspective view schematically illustrating a nonvolatile memory device according to another embodiment of the present disclosure.
Figure 7:
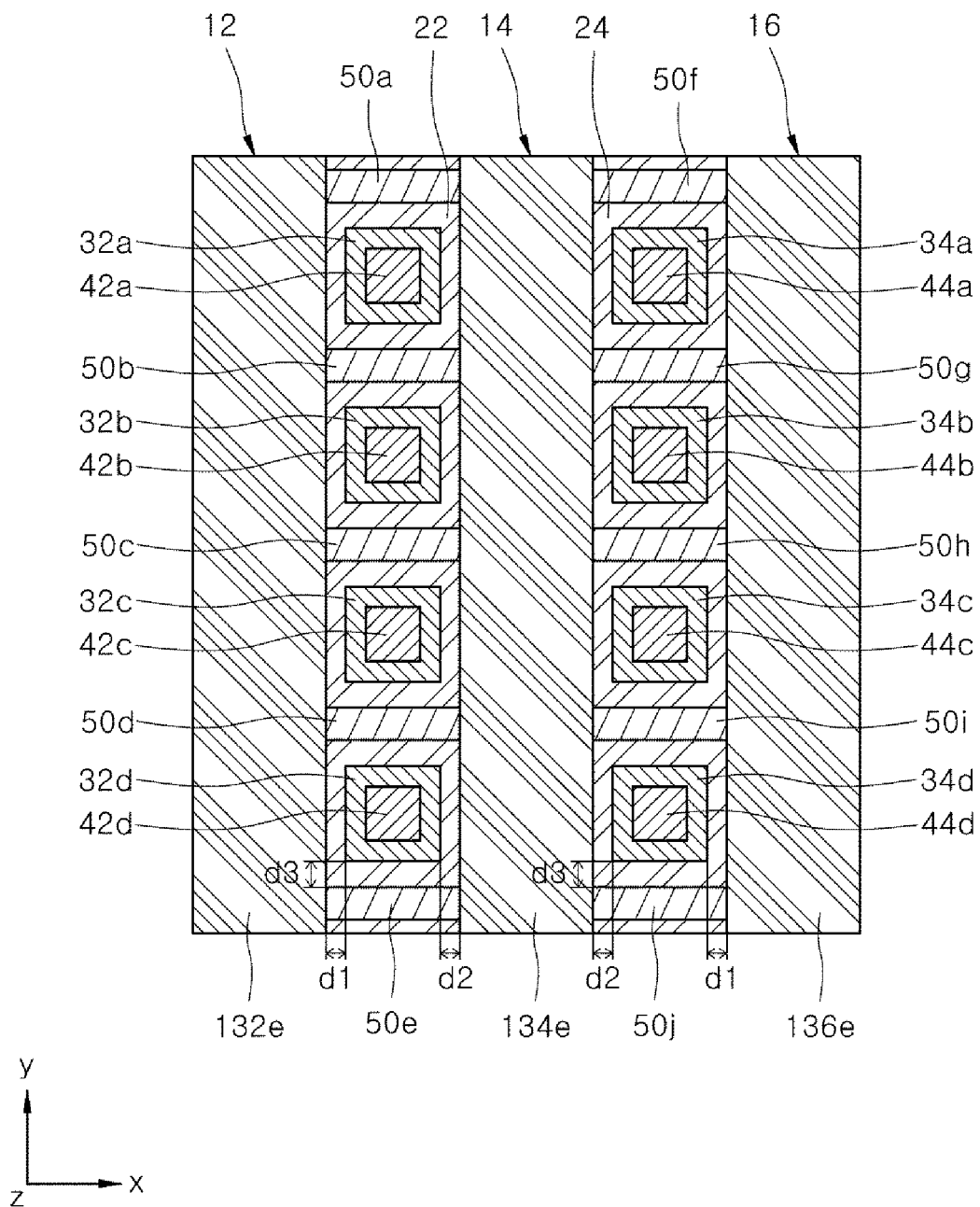
FIG. 7 is a plan view of the nonvolatile memory device of FIG. 6.

FIG. 6 is a perspective view schematically illustrating a nonvolatile memory device 2 according to another embodiment of the present disclosure. FIG. 7 is a plan view of the nonvolatile memory device of FIG. 6.

Referring to FIGS. 6 and 7, the nonvolatile memory device 2 may further include first to tenth cell insulation structures 50a, 50b, 50c, 50d, 50e, 50f, 50g, 50h, 50i and 50j, when compared to the nonvolatile memory device 1 of FIGS. 1 to 3.

The first to tenth cell insulation structures 50a, 50b, 50c, 50d, 50e, 50f, 50g, 50h, 50i and 50j may be disposed to extend along a first direction (i.e., the z-direction) from a base insulation layer 110. The first to tenth cell insulation structures 50a, 50b, 50c, 50d, 50e, 50f, 50g, 50h, 50i and 50j may be disposed to be spaced apart from each other along a second direction (i.e., the y-direction) inside first and second channel structures 22 and 24. That is, each of the first to tenth cell insulation structures 50a, 50b, 50c, 50d, 50e, 50f, 50g, 50h, 50i and 50j may be disposed, between or on one side of, ferroelectric structures 32a, 32b, 32c, 32d, 34a, 34b, 34c and 34d, respectively. The first to tenth cell insulation structures 50a, 50b, 50c, 50d, 50e, 50f, 50g, 50h, 50i and 50j may separate the corresponding first and second channel structures 22 and 24 along the second direction (i.e., the y-direction). Accordingly, during the operation of the nonvolatile memory device, electric signals that can interfere, between the channel layers of channel structures separated from each other, can be prevented or minimized using the first to tenth cell insulation structures 50a, 50b, 50c, 50d, 50e, 50f, 50g, 50h, 50i and 50j.

In an embodiment, the first to fifth cell insulation structures 50a, 50b, 50c, 50d and 50e may be disposed to contact the first source electrode structure 12 and the drain electrode structure 14 and span first channel structure 22 in a third direction (i.e., the x-direction). The sixth to tenth cell insulation structures 50f, 50g, 50h, 50i and 50j may be disposed to contact the second source electrode structure 16 and drain electrode structure 14 and span second channel structure 24 in the third direction (i.e., the x-direction).

The first to eighth ferroelectric structures 32a, 32b, 32c, 32d, 34a, 34b, 34c and 34d may be disposed to be spaced apart from the corresponding first to eighth cell insulation structures 50a, 50b, 50c, 50d, 50e, 50f, 50g, 50h, 50i and 50j by a third distance d3 in the second direction (i.e., the y-direction). In an embodiment, the third distance d3 may be the same as the first distance d1 or the second distance d2.

Figure 8:
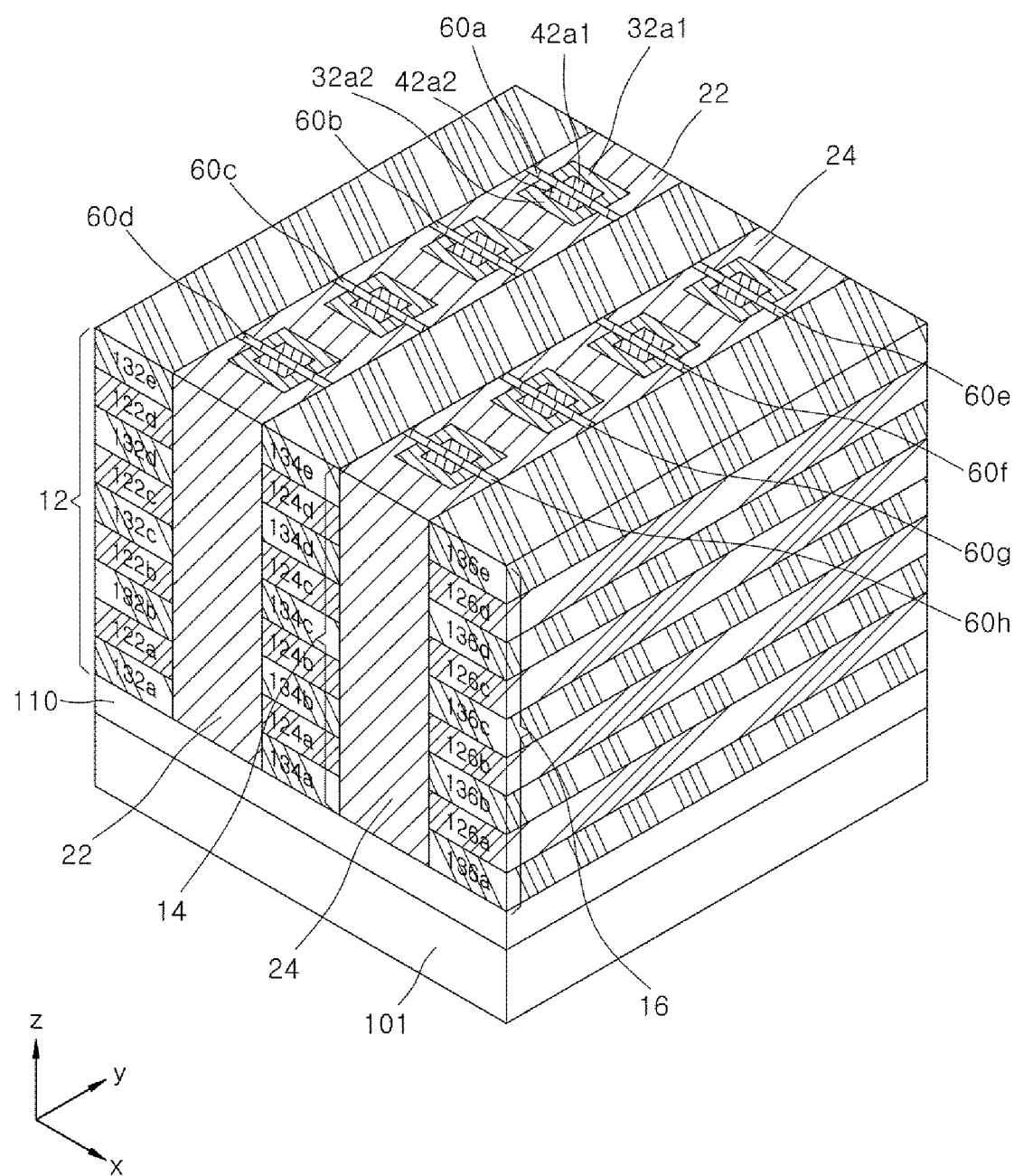
FIG. 8 is a perspective view schematically illustrating a nonvolatile memory device according to another embodiment of the present disclosure.
Figure 9:
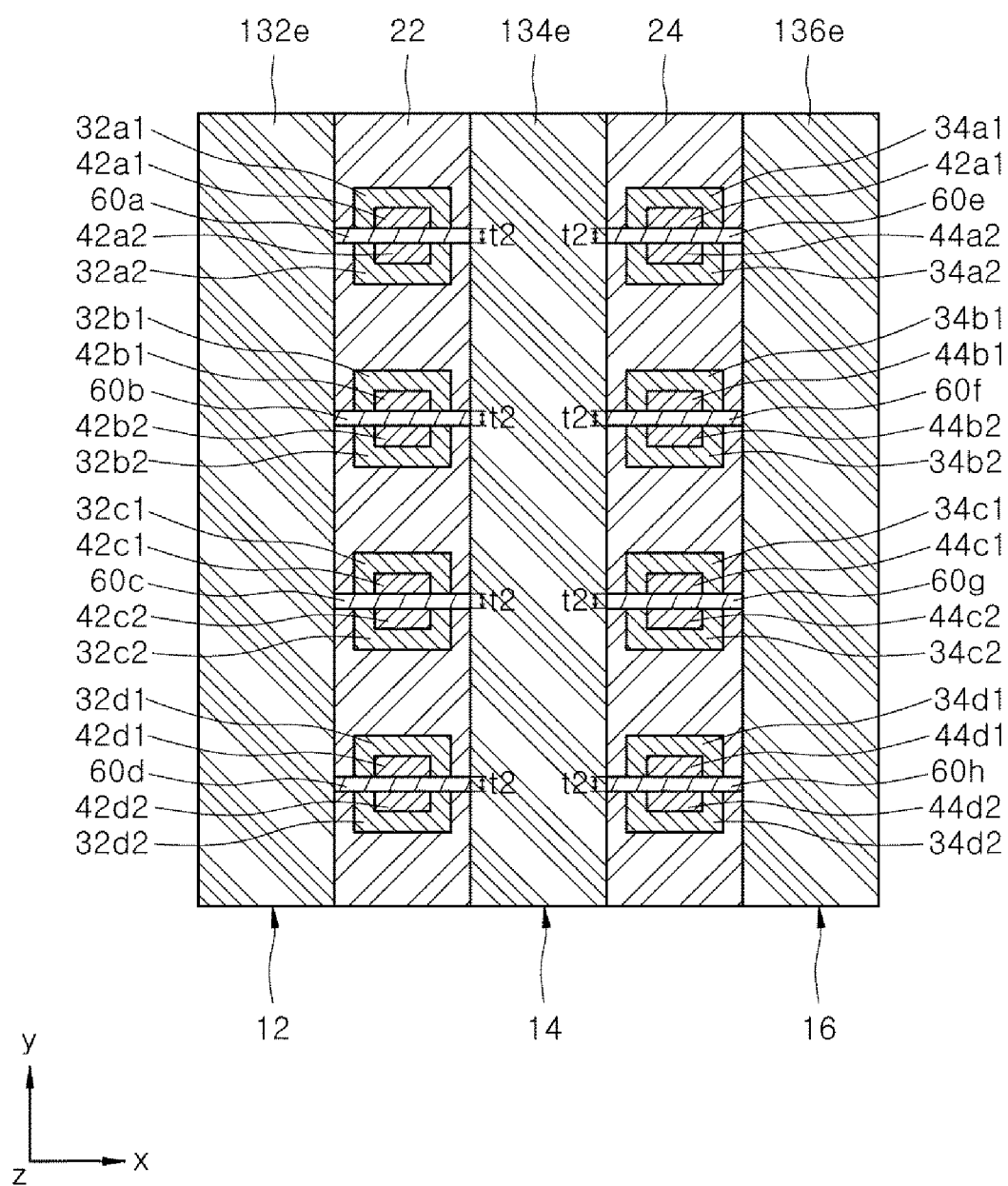
FIG. 9 is a plan view of the nonvolatile memory device of FIG. 8.

FIG. 8 is a perspective view schematically illustrating a nonvolatile memory device 3 according to another embodiment of the present disclosure. FIG. 9 is a plan view of the nonvolatile memory device of FIG. 8.

Referring to FIGS. 8 and 9, the nonvolatile memory device 3 may further include first to eighth cell division structures 60a, 60b, 60c, 60d, 60e, 60f, 60g and 60h, when compared to the nonvolatile memory device 1 of FIGS. 1 to 3.

The first to eighth cell division structures 60a, 60b, 60c, 60d, 60e, 60f, 60g and 60h may divide the first and second channel structures 22 and 24, the first to eighth ferroelectric structures 32a, 32b, 32c, 32d, 34a, 34b, 34c and 34d, and the first to eighth gate electrode structures 42a, 42b, 42c, 42d, 44a, 44b, 44c and 44d disclosed in FIGS. 1 to 3 on a base insulation layer 110 in a third direction (i.e., the x-direction). The first to eighth cell division structures 60a, 60b, 60c, 60d, 60e, 60f, 60g and 60h may be disposed to extend along a first direction (i.e., z-direction). The first to fourth cell division structures 60a, 60b, 60c and 60d may contact the first source electrode structure 12 and span first channel structure 22 in the x-direction to contact the drain electrode structure 14, and the fifth to eighth cell division structures 60e, 60f, 60g and 60h may contact the second source electrode structure 16 and span second channel structure 24 in the x-direction to contact the drain electrode structure 14. The first to eighth cell division structures 60a, 60b, 60c, 60d, 60e, 60f, 60g and 60h may be disposed to be spaced apart from each other along a second direction (i.e., the y-direction) and may each have a predetermined thickness t2.

Referring to FIGS. 8 and 9, a plurality of ferroelectric structures 32a1, 32a2, 32b1, 32b2, 32c1, 32c2, 32d1, 32d2, 34a1, 34a2, 34b1, 34b2, 34c1, 34c2, 34d1 and 34d2 and a plurality of gate electrode structures 42a1, 42a2, 42b1, 42b2, 42c1, 42c2, 42d1, 42d2, 44a1, 44a2, 44b1, 44b2, 44c1, 44c2, 44d1 and 44d2 may be disposed to be symmetrical to each other in the second direction (i.e., the y-direction), across the first to eighth cell division structures 60a, 60b, 60c, 60d, 60e, 60f, 60g and 60h, respectively.

The nonvolatile memory device 3 according to an embodiment has the first to eighth cell division structures 60a, 60b, 60c, 60d, 60e, 60f, 60g and 60h, so that the number of memory cells may be doubled, as compared to the nonvolatile memory device 1 of FIGS. 1 to 3. In addition, by independently controlling the plurality of gate electrode structures 42a1, 42a2, 42b1, 42b2, 42c1, 42c2, 42d1, 42d2, 44a1, 44a2, 44b1, 44b2, 44c1, 44c2, 44d1 and 44d2, respectively, the number of memory cells that can be driven independently increases.

Figure 10:
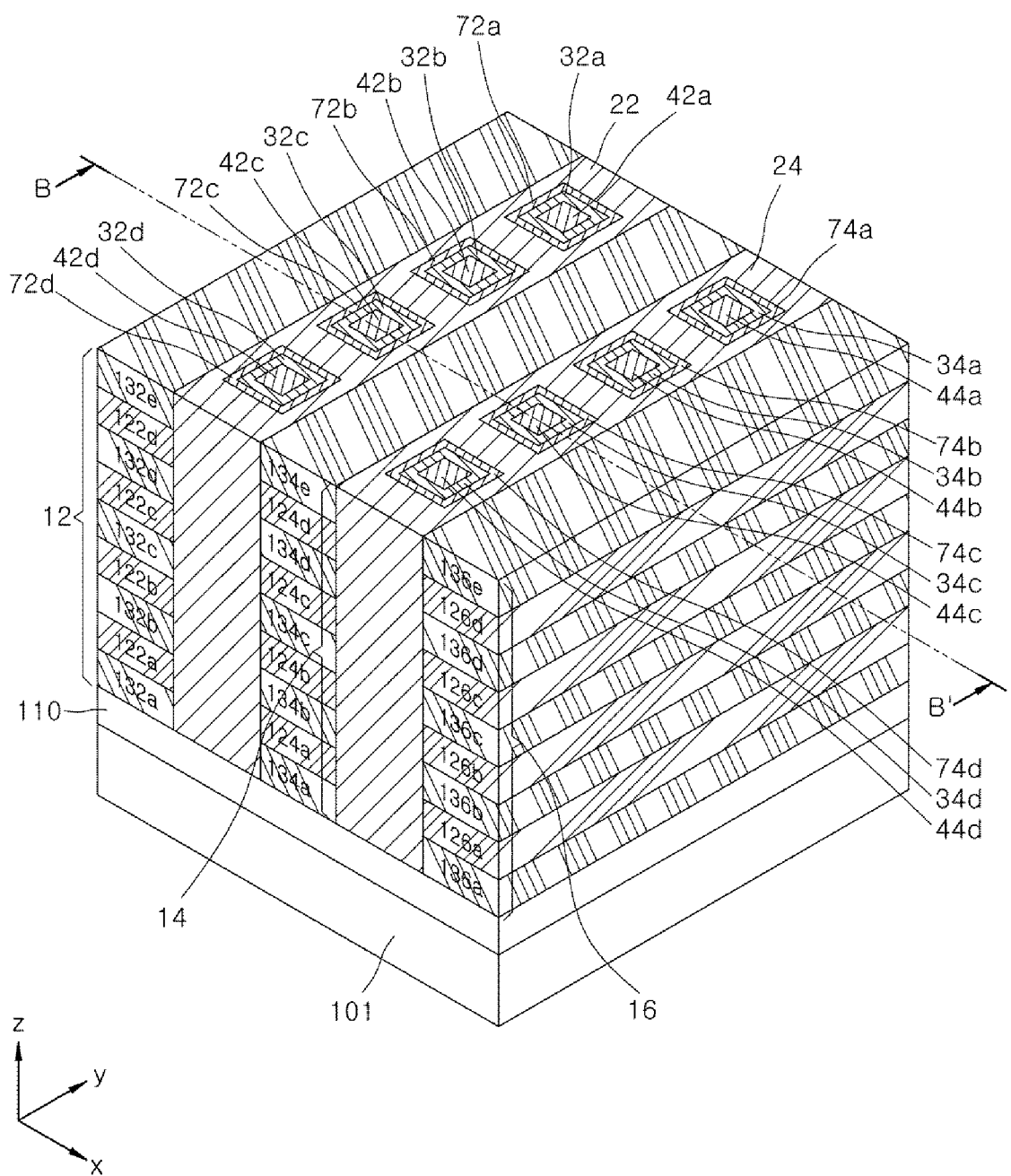
FIG. 10 is a perspective view schematically illustrating a nonvolatile memory device according to another embodiment of the present disclosure.
Figure 11:
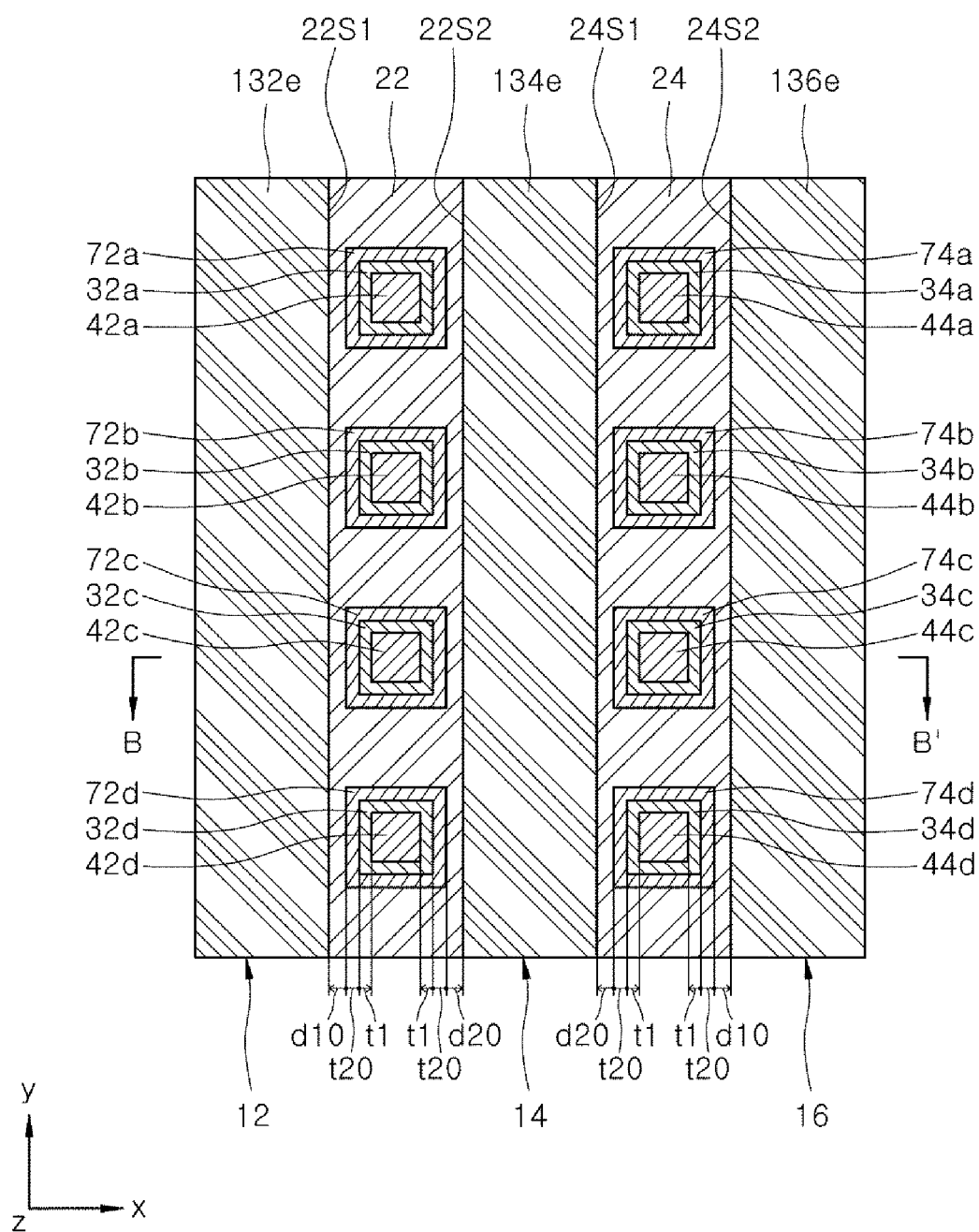
FIG. 11 is a plan view of the nonvolatile memory device of FIG. 10.
Figure 12:
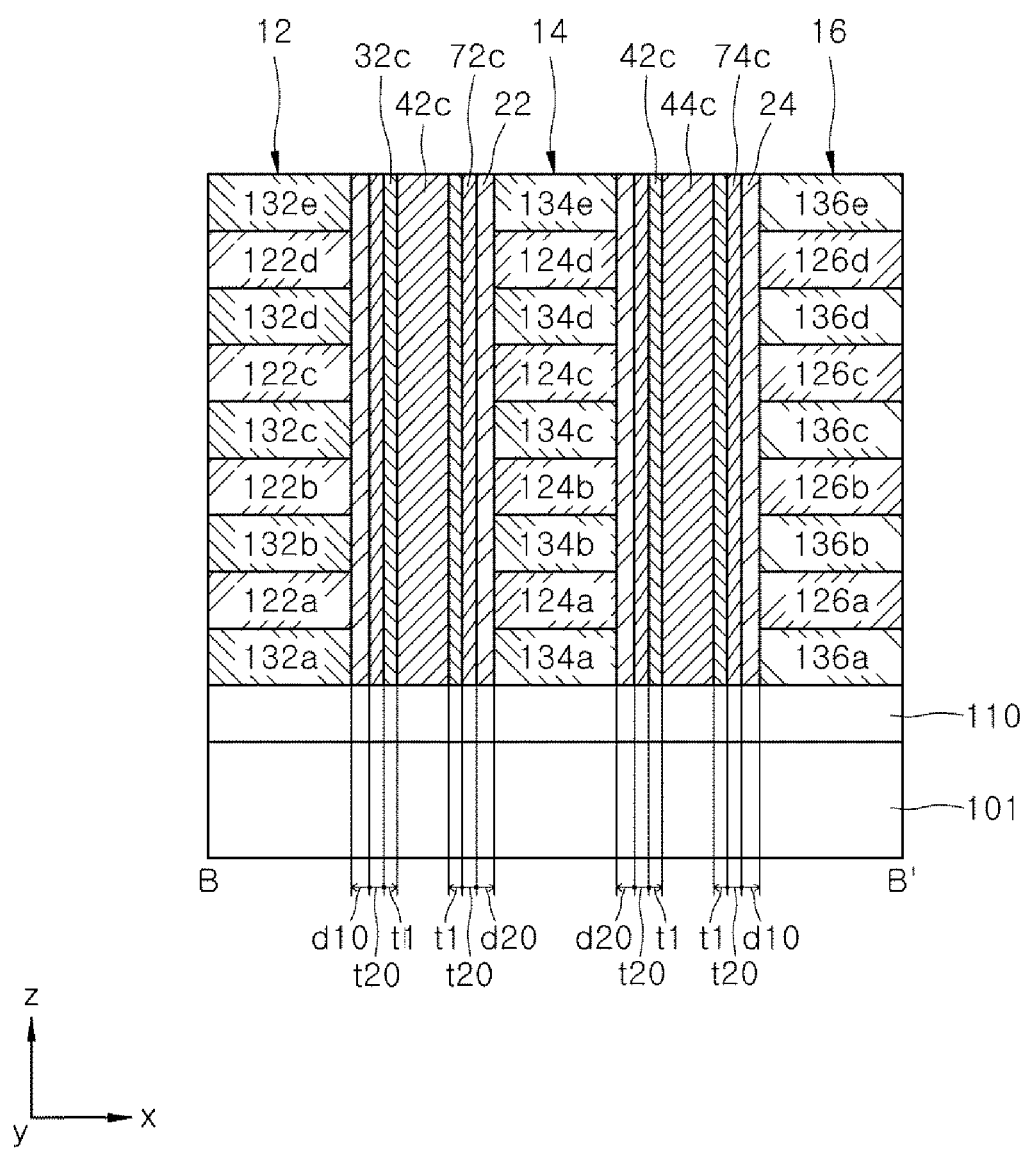
FIG. 12 is a cross-sectional view taken along the line B-B' of the nonvolatile memory device of FIG. 10.

FIG. 10 is a perspective view schematically illustrating a nonvolatile memory device 4 according to another embodiment of the present disclosure. FIG. 11 is a plan view of the nonvolatile memory device of FIG. 10. FIG. 12 is a cross-sectional view taken along the line B-B' of the nonvolatile memory device of FIG. 10. Referring to FIGS. 10 to 12, the nonvolatile memory device 4 may further include first to eighth interfacial dielectric structures 72a, 72b, 72c, 72d, 74a, 74b, 74c and 74d, as compared to the nonvolatile memory device 1 of FIGS. 1 to 3.

The first to fourth interfacial dielectric structures 72a, 72b, 72c and 72d may be disposed to surround the corresponding first to fourth ferroelectric structures 32a, 32b, 32c and 32d in a first channel structure 22 by a predetermined thickness t20, as measured outward from sidewall surfaces of the ferroelectric structures, as viewed in an x-y plane. The first to fourth interfacial dielectric structures 72a, 72b, 72c and 72d may be disposed to extend in the first direction (i.e., z-direction) on the base insulation layer 110. The first to fourth interfacial dielectric structures 72a, 72b, 72c and 72d may be disposed to be spaced apart from each other along a second direction (i.e., the y-direction).

In an embodiment, the first to fourth interfacial dielectric structures 72a, 72b, 72c and 72d may each have a band-like shape in the plan view of FIG. 11. The first to fourth interfacial dielectric structures 72a, 72b, 72c and 72d may be disposed to be spaced apart from a first sidewall surface 22S1 of the first channel structure 22 by a first distance d10 in a third direction (i.e., the x-direction) and may be disposed to be spaced apart from a second sidewall surface 22S2 of the first channel structure 22 by a second distance d20 in the third direction (i.e., the x-direction). In an embodiment, the first distance d10 and the second distance d20 may be the same. In other embodiments, the first distance d10 and the second distance d20 may be different.

The first to fourth interfacial dielectric structures 72a, 72b, 72c and 72d may suppress or prevent direct contact between the first channel structure 22 and the first to fourth ferroelectric structures 32a, 32b, 32c and 32d. That is, the first to fourth interfacial dielectric structures 72a, 72b, 72c and 72d can prevent defect sites, such as oxygen vacancies, from being generated through interdiffusion of materials occurring at interfaces between the first channel structure 22 and the first to fourth ferroelectric structures 32a, 32b, 32c and 32d. The first to fourth interfacial dielectric structures 72a, 72b, 72c and 72d may each have an amorphous structure. The first to fourth interfacial dielectric structures 72a, 72b, 72c and 72d may include, for example, silicon oxide, oxide nitride, or silicon oxynitride.

The fifth to eighth interfacial dielectric structures 74a, 74b, 74c and 74d in the second channel structure 24 may have substantially the same configuration as the first to fourth interfacial dielectric structures 72a, 72b, 72c and 72d in the first channel structure 22, and may perform substantially the same function. That is, the fifth to eighth interfacial dielectric structures 74a, 74b, 74c and 74d may extend in the first direction (i.e., the z-direction) on the base insulation layer 110, and may be disposed to be spaced apart from each other in the second direction (i.e., the y-direction). Referring to FIGS. 11 and 12, the fifth to eighth interfacial dielectric structures 74a, 74b, 74c and 74d may be disposed to surround the corresponding fifth to eighth ferroelectric structures 34a, 34b, 34c and 34d, in the first direction (i.e., the z-direction), by a predetermined thickness t20 as measured outward from sidewall surfaces of the ferroelectric structures, as viewed in an x-y plane. The fifth to eighth interfacial dielectric structures 74a, 74b, 74c and 74d may be disposed to be spaced apart from a first sidewall surface 24S1 of the second channel structure 24 by a second distance d20 in the third direction (i.e., the x-direction), and may be disposed to be spaced apart from a second sidewall surface 24S2 of the second channel structure 24 by a first distance d10 in the third direction (i.e., the x-direction). The fifth to eighth interfacial dielectric structures 74a, 74b, 74c and 74d can prevent the second channel structure 24 from directly contacting the fifth to eighth ferroelectric structures 34a, 34b, 34c and 34d.

Figure 13:
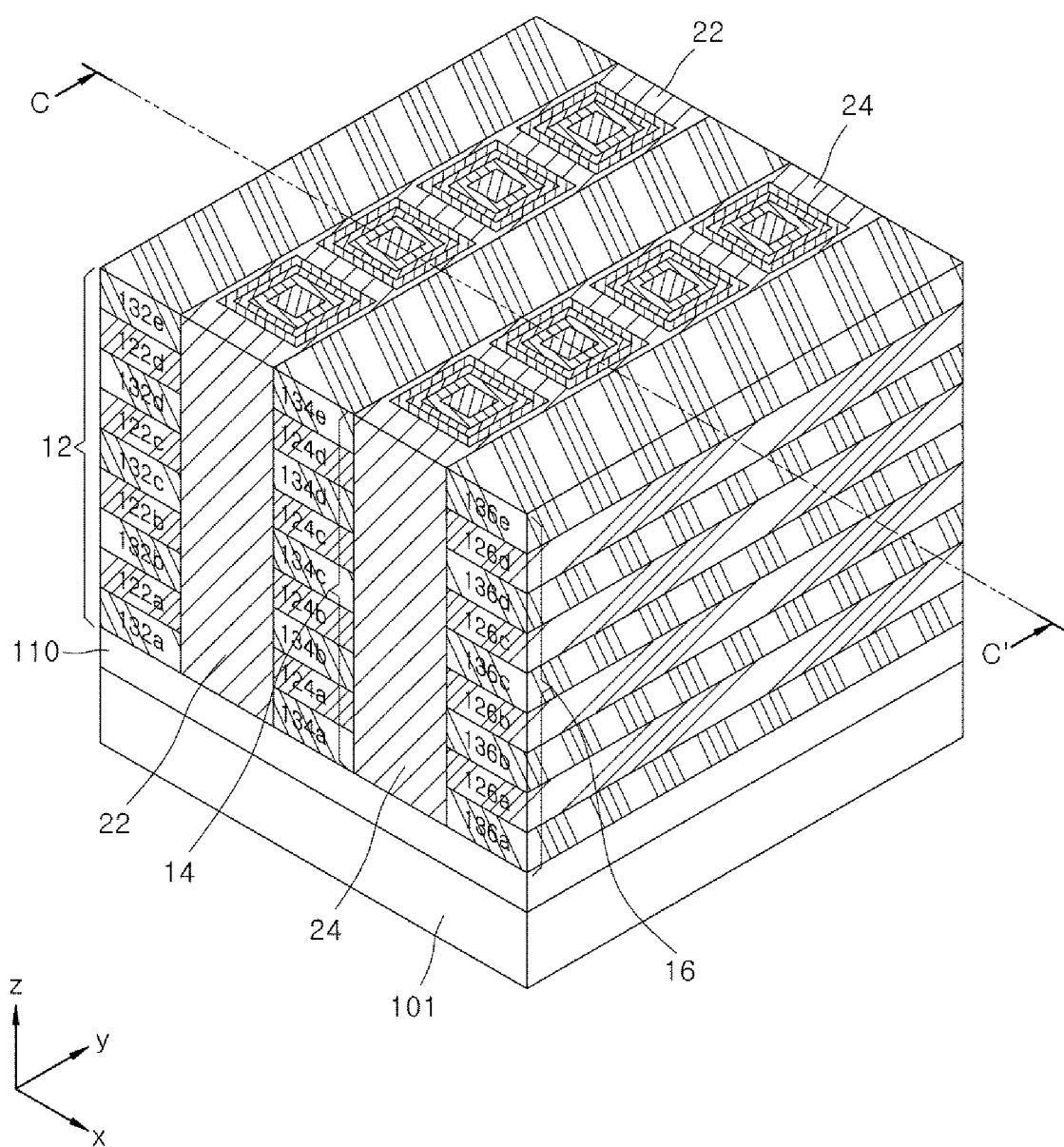
FIG. 13 is a perspective view schematically illustrating a nonvolatile memory device according to another embodiment of the present disclosure.
Figure 14:
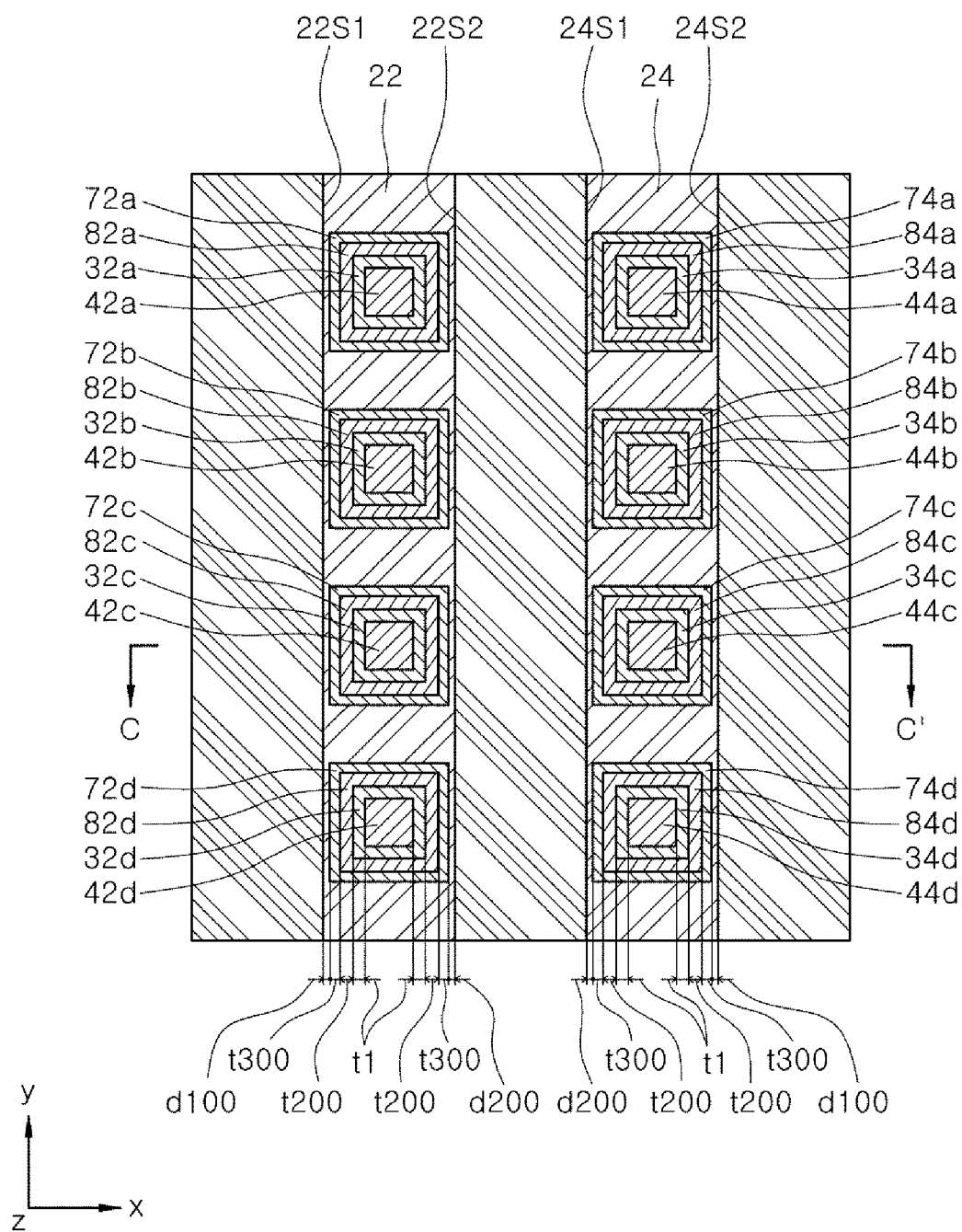
FIG. 14 is a plan view of the nonvolatile memory device of FIG. 13.
Figure 15:
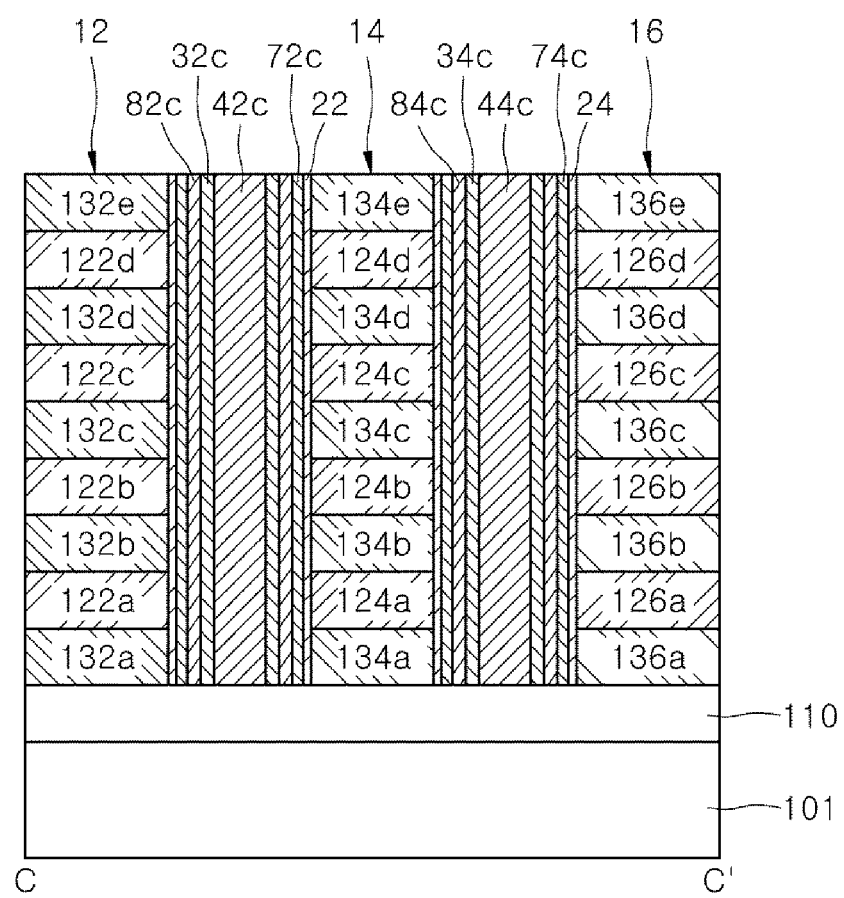
FIG. 15 is a cross-sectional view taken along the line C-C' of the nonvolatile memory device of FIG. 13.

FIG. 13 is a perspective view schematically illustrating a nonvolatile memory device 5 according to another embodiment of the present disclosure. FIG. 14 is a plan view of the nonvolatile memory device of FIG. 13. FIG. 15 is a cross-sectional view taken along the line C-C' of the nonvolatile memory device of FIG. 13.

Referring to FIGS. 13 to 15, a nonvolatile memory device 5 may further include first to eighth floating electrode structures 82a, 82b, 82c, 82d, 84a, 84b, 84c and 84d, when compared to the nonvolatile memory device 4 of FIGS. 10 to 12.

The first to fourth floating electrode structures 82a, 82b, 82c and 82d may be respectively disposed to surround the corresponding first to fourth ferroelectric structures 32a, 32b, 32c and 32d by a predetermined thickness t200 as measured outward from sidewall surfaces of the ferroelectric structures, as viewed in an x-y plane. The first to fourth floating electrode structures 82a, 82b, 82c and 82d may be disposed to extend in the first direction (i.e., the z-direction) on the base insulation layer 110. The first to fourth floating electrode structures 82a, 82b, 82c and 82d may be disposed to be spaced apart from each other along a second direction (i.e., the y-direction).

In an embodiment, each of the first to fourth floating electrode structures 82a, 82b, 82c and 82d may have a band-like shape in the plan view of FIG. 14. Here, the first to fourth interfacial insulation structures 72a, 72b, 72c and 72d may be disposed to surround the corresponding first to fourth floating electrode structures 82a, 82b, 82c and 82d, respectively by a predetermined thickness t300, as measured outward from sidewall surfaces of the floating electrode structures, as viewed in an x-y plane. The first to fourth interfacial insulation structures 72a, 72b, 72c and 72d may be disposed to be spaced apart from a first sidewall surface 22S1 of the first channel structure 22 in a third direction (i.e., the x-direction) by a first distance d100 and to be spaced apart from a second sidewall surface 22S2 of the first channel structure 22 in the third direction (i.e., the x-direction) by a second distance d200.

Accordingly, the first to fourth floating electrode structures 82a, 82b, 82c and 82d may be disposed between the first to fourth interfacial insulation structures 72a, 72b, 72c and 72d and the first to fourth ferroelectric structures 32a, 32b, 32c and 32d, and may maintain electrically floating states. The first to fourth floating electrode structures 82a, 82b, 82c and 82d may charge positive charges or negative charges therein according to voltages applied to the corresponding first to fourth gate electrode structures 42a, 42b, 42c and 42d. The charged positive charges or negative charges function to stabilize the remanent polarization stored in the first to fourth ferroelectric structures 32a, 32b, 32c and 32d, thereby improving the retention of the remanent polarization.

Likewise, the fifth to eighth floating electrode structures 84a, 84b, 84c and 84d common to the corresponding fifth to eighth interfacial insulation structures 74a, 74b, 74c and 74d have substantially the same configurations as the first to fourth floating electrode structures 82a, 82b, 82c and 82d common to the first to fourth interfacial insulation structures 72a, 72b, 72c and 72d, and may perform substantially the same functions. That is, the fifth to eighth floating electrode structures 84a, 84b, 84c and 84d may be disposed to surround the corresponding fifth to eighth ferroelectric structures 34a, 34b, 34c and 34d along the first direction (i.e., the z-direction), by a predetermined thickness t200. That is, the fifth to eighth floating electrode structures 84a, 84b, 84c and 84d may each have a band-like shape in the plan view of FIG. 14. In this case, the fifth to eighth interfacial insulation structures 74a, 74b, 74c and 74d may be disposed to surround the corresponding fifth to eighth floating electrode structures 84a, 84b, 84c and 84d by a predetermined thickness t300. Here, the fifth to eighth interfacial insulation structures 74a, 74b, 74c and 74d may be disposed to be spaced apart from a first sidewall surface 24S1 of the second channel structure 24 in the third direction (i.e., the x-direction) by a second distance d200 and may be disposed to be spaced apart from a second sidewall surface 22S2 of the first channel structure 22 with respect to the third direction (i.e., the x-direction) by the first distance d100.

The fifth to eighth floating electrode structures 84a, 84b, 84c and 84d may charge positive charges or negative charges therein according to a voltage applied to the corresponding fifth to eighth gate electrode structures 44a, 44b, 44c and 44d. The charged positive charges or negative charges function to stabilize the remanent polarization stored in the fifth to eighth ferroelectric structures 34a, 34b, 34c and 34d, thereby improving retention of the remanent polarization.

Figure 16:
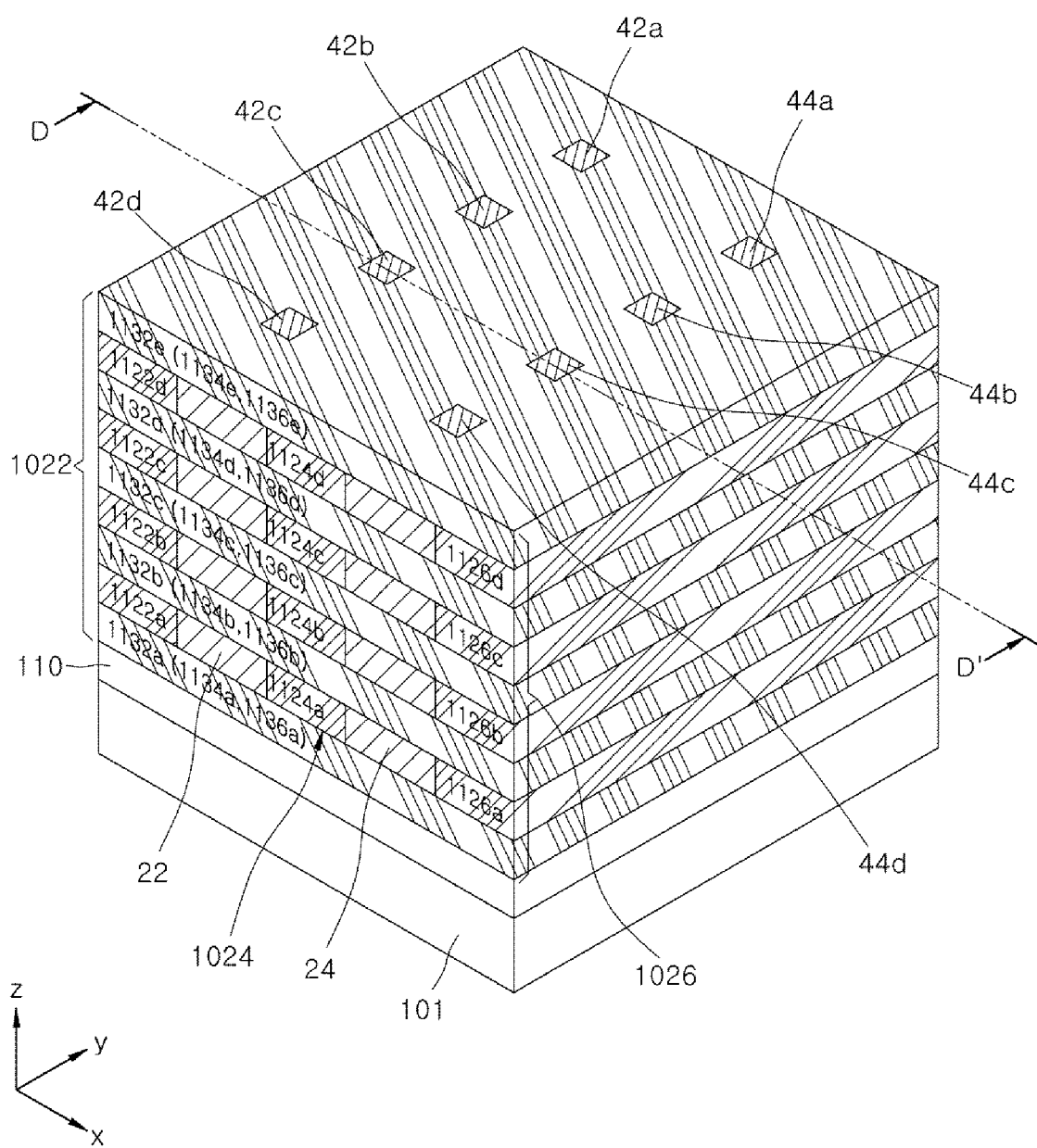
FIG. 16 is a perspective view schematically illustrating a nonvolatile memory device according to another embodiment of the present disclosure.
Figure 17:
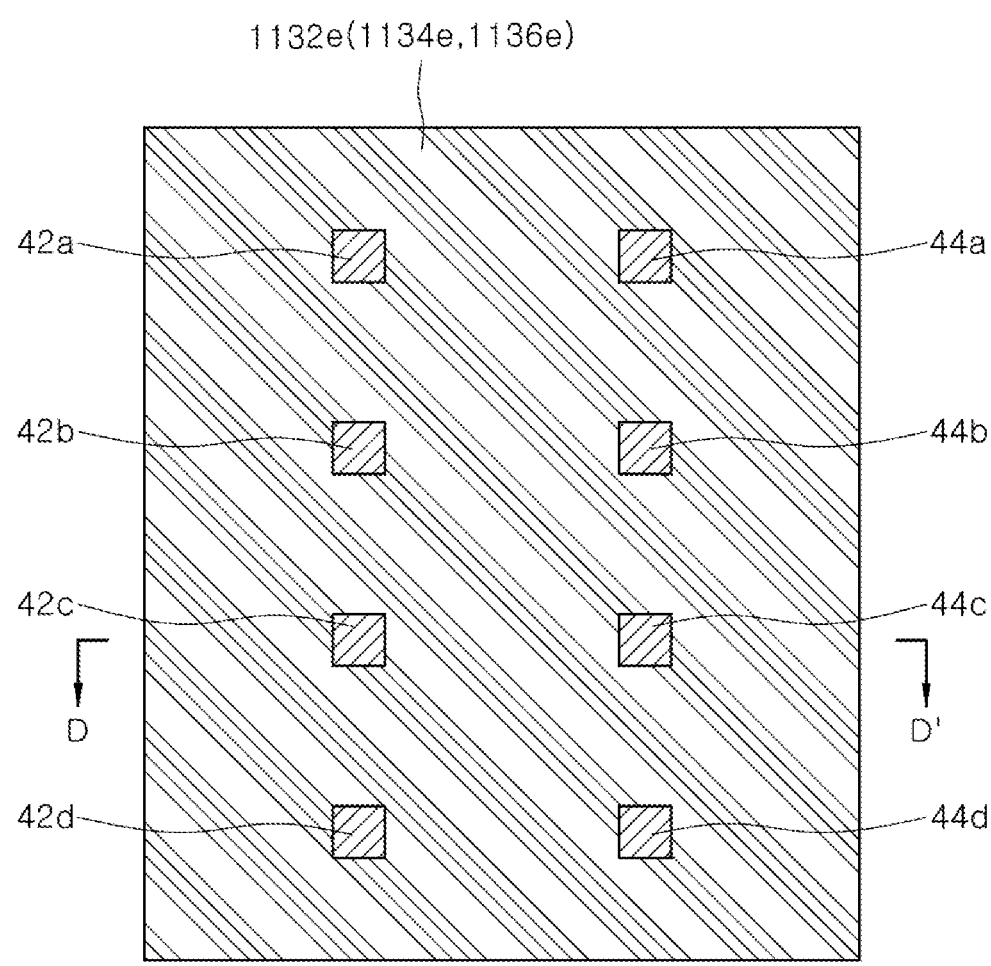
FIG. 17 is a plan view of the nonvolatile memory device of FIG. 16.
Figure 18:
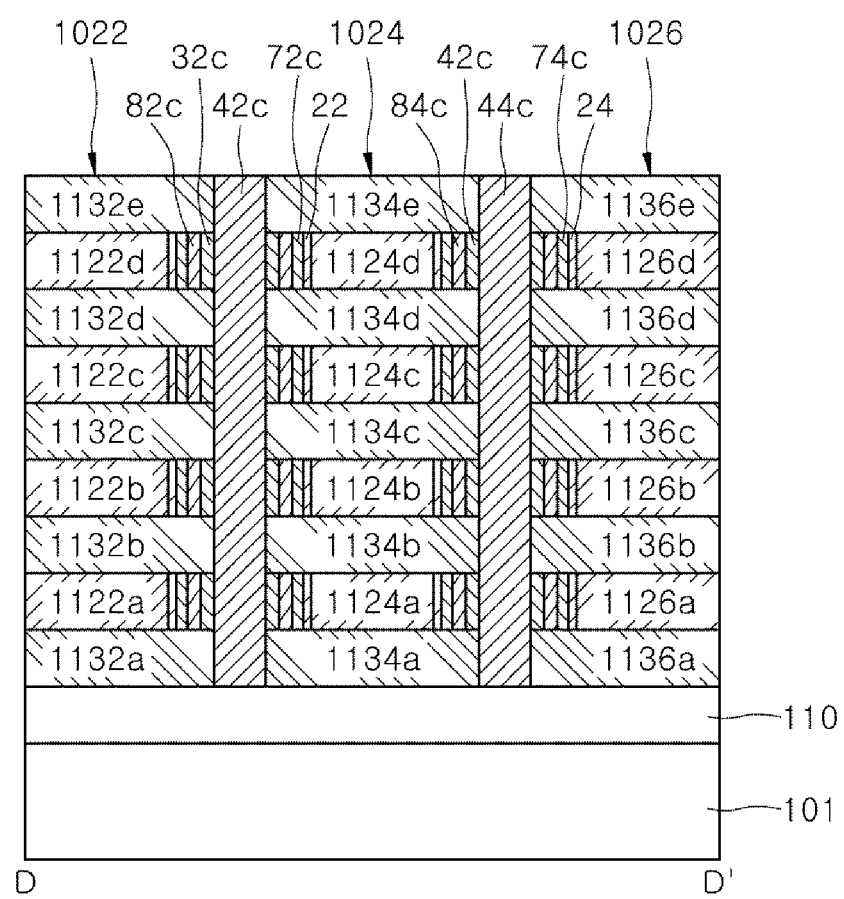
FIG. 18 is a cross-sectional view taken along the line D-D' of the nonvolatile memory device of FIG. 16.

FIG. 16 is a perspective view schematically illustrating a nonvolatile memory device 6 according to another embodiment of the present disclosure. FIG. 17 is a plan view of the nonvolatile memory device of FIG. 16. FIG. 18 is a cross-sectional view taken along the line D-D' of the nonvolatile memory device of FIG. 16.

Referring to FIGS. 16 to 18, the nonvolatile memory device 6 may be different from the nonvolatile memory device 5 described above with reference to FIGS. 13 to 15 in configurations of first and second source electrode structures 1022 and 1026 and a drain electrode structure 1024.

In this embodiment, the first source electrode structure 1022 may include first to fourth source electrode layer patterns 1122a, 1122b, 1122c and 1122d, alternately stacked along a first direction (i.e., the z-direction) with first to fifth source insulation layer patterns 1132a, 1132b, 1132c, 1132d and 1132e. The second source electrode structure 1026 may include first to fourth source electrode layer patterns 1126a, 1126b, 1126c and 1126d, alternately stacked along a first direction (i.e., the z-direction) with first to fifth source insulation layer patterns 1136a, 1136b, 1136c, 1136d and 1136e. The drain electrode structure 1024 may include first to fourth drain electrode layer patterns 1124a, 1124b, 1124c and 1124d, alternately stacked along a first direction (i.e., the z-direction) with first to fifth source insulation layer patterns 1134a, 1134b, 1134c, 1134d and 1134e.

Referring to FIGS. 16 to 18, the first to fourth source electrode layer patterns 1122a, 1122b, 1122c and 1122d of the first source electrode structure 1022 may be disposed to contact a first channel structure 22 along a third direction (i.e., the x-direction). On the other hand, the first to fifth source insulation layer patterns 1132a, 1132b, 1132c, 1132d and 1132e may be disposed to directly contact first to fourth gate electrode structures 42a, 42b, 42c and 42d. That is, the first to fifth source insulation layer patterns 1132a, 1132b, 1132c, 1132d and 1132e separate the first to the fourth ferroelectric structures 32a, 32b, 32c and 32d, the first to the fourth floating electrode structures 82a, 82b, 82c and 82d, the first to the fourth interfacial dielectric structures 72a, 72b, 72c and 72d and the first channel structure 22 with respect to the second and third direction (i.e., the x-direction and the y-direction).

In this embodiment, the first to fifth source insulation layer patterns 1132a, 1132b, 1132c, 1132d and 1132e can more effectively implement electrical insulation between the first to fourth source electrode layer patterns 1122a, 1122b, 1122c and 1122d in the first direction (i.e., the z-direction).

Likewise, the first to fourth source electrode layer patterns 1126a, 1126b, 1126c and 1126d of the second source electrode structure 1026 may be disposed to contact a second channel structure 24 along the third direction (i.e., the x-direction). On the other hand, the first to fifth source insulation layer patterns 1136a, 1136b, 1136c, 1136d and 1136e may be disposed to directly contact the fifth to eighth gate electrode structures 44a, 44b, 44c and 44d. That is, the first to fifth source insulation layer patterns 1136a, 1136b, 1136c, 1136d and 1136e separate the fifth to the eighth ferroelectric structures 34a, 34b, 34c and 34d, the fifth to the eighth floating electrode structures 84a, 84b, 84c and 84d, the fifth to the eighth interfacial dielectric structures 74a, 74b, 74c and 74d and the second channel structure 24 with respect to the second and third direction (i.e., the x-direction and the y-direction).

In this embodiment, the first to fifth source insulation layer patterns 1136a, 1136b, 1136c, 1136d and 1136e can more effectively implement electrical insulation between the first to fourth source electrode layer patterns 1126a, 1126b, 1126c and 1126d of the second source electrode structure 1026 along the first direction (i.e., the z-direction).

The first to fourth drain electrode layer patterns 1124a, 1124b, 1124c and 1124d of the drain electrode structure 1024 may be disposed to contact the first and second channel structures 22 and 24, respectively in the third direction (i.e., the x-direction). On the other hand, the first to fifth drain insulation layer patterns 1134a, 1134b, 1134c, 1134d and 1134e may be disposed to direct contact the first to eighth gate electrode structures 42a, 42b, 42c, 42d, 44a, 44b, 44c and 44d. That is, the first to fifth drain insulation layer patterns 1134a, 1134b, 1134c, 1134d and 1134e separate the first to the eighth ferroelectric structures 32a, 32b, 32c, 32d, 34a, 34b, 34c and 34d, the first to the eighth floating electrode structures 82a, 82b, 82c, 82d, 84a, 84b, 84c and 84d, the first to the eighth interfacial dielectric structures 72a, 72b, 72c, 72d, 74a, 74b, 74c and 74d, and the first and the second channel structure 22 and 24 with respect to the second and third direction (i.e., the x-direction and the y-direction).

In this embodiment, the first to fifth drain insulation layer patterns 1134a, 1134b, 1134c, 1134d and 1134e can more effectively implement electrical insulation between the first to fourth drain electrode layer patterns 1124a, 1124b, 1124c and 1124d of the drain electrode structure 1024 along the first direction (i.e., the z-direction).

In some other embodiments, the configurations of the first and second source electrode structures 1022 and 1026 and the drain electrode structure 1024 of the nonvolatile memory device 6 described above with reference to FIGS. 16 to 18 may be applied to the configurations of the first and second source electrode structures 12 and 16 and the drain electrode structure 14 of the nonvolatile memory device 1 described above with reference to FIGS. 1 to 3. Accordingly, in some embodiments, the first to fifth source insulation layer patterns 132a, 132b, 132c, 132d and 132e of the first source electrode structure 12 in the structures of FIGS. 1 to 3 may be disposed to directly contact the first to fourth gate electrode structures 42a, 42b, 42c and 42d. On the other hand, the first to fourth source electrode layer patterns 122a, 122b, 122c and 122d of the first source electrode structure 12 may be disposed to contact the first channel structure 22 along the third direction (i.e., the x-direction).

Likewise, in some embodiments, the first to fifth source insulation layer patterns 136a, 136b, 136c, 136d and 136e of the second source electrode structure 16 in the structures of FIGS. 1 to 3 may be disposed to directly contact the fifth to eighth gate electrode structures 44a, 44b, 44c and 44d. On the other hand, the first to fourth source electrode layer patterns 126a, 126b, 126c and 126d of the second source electrode structure 16 may be disposed to contact the second channel structure 24 along the third direction (i.e., the x-direction).

In addition, the first to fifth drain insulation layer patterns 134a, 134b, 134c, 134d and 134e of the drain electrode structure 14 in the structure of FIGS. 1 to 3 may be disposed to directly contact the first to eighth gate electrode structures 42a, 42b, 42c, 42d, 44a, 44b, 44c and 44d.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
    a substrate having an upper surface;
    a source electrode structure disposed over the substrate, the source electrode structure comprising a plurality of source electrode layer patterns and a plurality of source insulation layer patterns that are alternately stacked along a first direction perpendicular to the upper surface, wherein the source electrode structure extends in a second direction perpendicular to the first direction;
    a channel structure disposed over the substrate and disposed to contact one sidewall surface of the source electrode structure, the one sidewall surface of the source electrode structure forming a plane substantially parallel to the first and second directions;
    a drain electrode structure disposed over the substrate to contact one sidewall surface of the channel structure, the drain electrode structure comprising a plurality of drain electrode layer patterns and a plurality of drain insulation layer patterns that are alternately stacked along the first direction, wherein the drain electrode structure extends in the second direction;
    a plurality of ferroelectric structures extending in the first direction in the channel structure and disposed to be spaced apart from each other along the second direction; and
    a gate electrode structure disposed in each of the plurality of ferroelectric structures to extend along the first direction,
    wherein the source electrode structure and the drain electrode structure are spaced apart from each other in a direction perpendicular to the first and second directions.

2. The nonvolatile memory device of claim 1, further comprising a base insulation layer disposed on the substrate and contacting the source electrode structure, the channel structure, the drain structure, the ferroelectric structures and the gate electrode structure.

3. The nonvolatile memory device of claim 1, wherein the ferroelectric structures are disposed to surround the gate electrode structure along the first direction by a predetermined thickness.

4. The nonvolatile memory device of claim 1, wherein each of the ferroelectric structures comprises at least one selected from the group consisting of hafnium oxide, zirconium oxide, and hafnium zirconium oxide.

5. The nonvolatile memory device of claim 1, wherein the channel structure comprises doped semiconductor or metal oxide.

* * * * *